(12) United States Patent
Hirano et al.

(10) Patent No.: US 8,586,288 B2
(45) Date of Patent: Nov. 19, 2013

(54) METHOD OF FORMING RESIST PATTERN

(75) Inventors: Tomoyuki Hirano, Kawasaki (JP); Daiju Shiono, Kawasaki (JP)

(73) Assignee: Tokyo Ohka Kogyo Co., Ltd., Kawasaki-shi (JP)

(*) Notice: Subject to any disclaimer, the term of this patent is extended or adjusted under 35 U.S.C. 154(b) by 0 days.

(21) Appl. No.: 13/372,740

(22) Filed: Feb. 14, 2012

(65) Prior Publication Data

US 2012/0208131 A1   Aug. 16, 2012

(30) Foreign Application Priority Data

Feb. 14, 2011 (JP) ............... P2011-028986

(51) Int. Cl.
*G03F 7/26* (2006.01)

(52) U.S. Cl.
USPC .................................................. 430/322

(58) Field of Classification Search
USPC .................................... 430/322, 325, 326
See application file for complete search history.

(56) References Cited

U.S. PATENT DOCUMENTS

| | | | | |
|---|---|---|---|---|
| 5,585,222 A * | 12/1996 | Kaimoto et al. | ............... | 430/296 |
| 5,908,730 A | 6/1999 | Nitta et al. | | |
| 6,153,733 A | 11/2000 | Yukawa et al. | | |
| 2002/0001772 A1 * | 1/2002 | Nishi et al. | ............... | 430/270.1 |
| 2004/0110085 A1 | 6/2004 | Iwai et al. | | |
| 2010/0310985 A1 * | 12/2010 | Mori et al. | ............... | 430/270.1 |

FOREIGN PATENT DOCUMENTS

| | | |
|---|---|---|
| JP | A-06-194847 | 7/1994 |
| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2002-090991 | 3/2002 |
| JP | A-2003-241385 | 8/2003 |
| WO | WO 2004/074242 A2 | 9/2004 |

OTHER PUBLICATIONS

Gil et al.; "First Microprocessors with Immersion Lithography," Proceedings of SPIE, vol. 5754, pp. 119-128 (2005).
Ebihara et al.; "Beyond $k_1=0.25$ Lithography: 70nm L/S Patterning Using KrF Scanners," Proceedings of SPIE (U.S.), vol. 5256, pp. 985-994 (2003).
Yan Borodovsky; "Marching to the Beat of Moore's Law," Proceedings of SPIE (U.S.), vol. 6153, pp. 1-19 (2006).

* cited by examiner

*Primary Examiner* — Brittany Raymond
(74) *Attorney, Agent, or Firm* — Knobbe Martens Olson & Bear LLP

(57) ABSTRACT

A method of forming a resist pattern including: forming a resist film on a substrate using a resist composition containing a base component (A) which exhibits increased solubility in an organic solvent under action of acid and an acid generator component which generates acid upon exposure; conducting exposure of the resist film; and patterning the resist film by positive development using a developing solution containing the organic solvent to form a resist pattern, wherein a resin component containing a structural unit derived from an acrylate ester which may have a hydrogen atom bonded to a carbon atom on the α-position substituted with a substituent and contains an acid decomposable group which exhibits increased polarity by action of acid is used as the component (A), and a developing solution that contains a polar organic solvent but contains substantially no alkali components is used as the developing solution.

6 Claims, No Drawings

METHOD OF FORMING RESIST PATTERN

BACKGROUND OF THE INVENTION

1. Field of the Invention

The present invention relates to a method of forming a resist pattern by a positive development process using a developing solution containing an organic solvent.

Priority is claimed on Japanese Patent Application No. 2011-028986, filed Feb. 14, 2011, the content of which is incorporated herein by reference.

2. Description of Related Art

Techniques (pattern-forming techniques) in which a fine pattern is formed on top of a substrate, and a lower layer beneath that pattern is then fabricated by conducting etching with this pattern as a mask are widely used in the production of semiconductor devices and liquid crystal display devices. These types of fine patterns are usually formed from an organic material, and are formed, for example, using a lithography method or a nanoimprint method or the like. In a lithography method, for example, a resist film composed of a resist material containing a base component such as a resin is formed on a support such as a substrate, and the resist film is subjected to selective exposure of radial rays such as light or electron beam, followed by development, thereby forming a resist pattern having a predetermined shape on the resist film. Using this resist pattern as a mask, a semiconductor device or the like is produced by conducting a step in which the substrate is processed by etching.

The aforementioned resist material can be classified into positive types and negative types. A resist material in which the exposed portions exhibit increased solubility in a developing solution is called a positive type, and a resist material in which the exposed portions exhibit decreased solubility in a developing solution is called a negative type.

In general, an aqueous alkali solution (alkali developing solution) such as an aqueous solution of tetramethylammonium hydroxide (TMAH) is used as the developing solution. Alternatively, organic solvents such as aromatic solvents, aliphatic hydrocarbon solvents, ether solvents, ketone solvents, ester solvents, amide solvents and alcohol solvents are used as the developing solution (for example, see Patent Document 1).

In recent years, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As shortening of the wavelength of the exposure light source progresses, it is required to improve various lithography properties of the resist material, such as the sensitivity to the exposure light source and the resolution capable of reproducing patterns of minute dimensions. As resist materials which satisfy such requirements, chemically amplified resists are known.

As a chemically amplified resist, a composition including a base component that exhibits a changed solubility in a developing solution under the action of acid and an acid generator component that generates acid upon exposure is generally used. For example, when the above developing solution is an alkali developing solution (when the process is an alkali developing process), as the base component, a base component that exhibits increased solubility in an alkali developing solution by the action of acid is used.

Conventionally, a resin (base resin) is mainly used as the base component of a chemically amplified resist composition. Currently, resins that contain structural units derived from (meth)acrylate esters within the main chain (acrylic resins) are the mainstream as base resins for chemically amplified resist compositions that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

In general, the base resin contains a plurality of structural units for improving lithography properties and the like. For example, a structural unit having a lactone structure and a structural unit having a polar group such as a hydroxyl group are used, as well as a structural unit having an acid decomposable group which is decomposed by the action of an acid generated from the acid generator to form an alkali soluble group (for example, see Patent Document 2). When the base resin is an acrylic resin, as the acid decomposable group, in general, resins in which the carboxy group of (meth)acrylic acid or the like is protected with an acid dissociable group such as a tertiary alkyl group or an acetal group are used.

As a technique for further improving the resolution, a lithography method called liquid immersion lithography (hereafter, frequently referred to as "immersion exposure") is known in which exposure (immersion exposure) is conducted in a state where the region between the objective lens of the exposure apparatus and the sample is filled with a solvent (an immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted by applying a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion exposure is effective in forming patterns having various shapes. Further, immersion exposure is expected to be capable of being used in combination with currently studied super-resolution techniques, such as phase shift method and modified illumination method. Currently, as the immersion exposure technique, technique using an ArF excimer laser as an exposure source is being actively studied. Further, water is mainly used as the immersion medium.

As a lithography technique which has been recently proposed, a double patterning process is known in which patterning is conducted two or more times to form a resist pattern (for example, see Non-Patent Documents 2 and 3). There are several different types of double patterning process, for example, (1) a method in which a lithography step (from application of resist compositions to exposure and developing) and an etching step are performed twice or more to form a pattern and (2) a method in which the lithography step is successively performed twice or more. According to the double patterning process, a resist pattern with a higher level of resolution can be formed, as compared to the case where a resist pattern is formed by a single lithography step (namely, a single patterning process), even when a light source with the same exposure wavelength is used, or even when the same resist composition is used. Furthermore, double patterning process can be conducted using a conventional exposure apparatus.

Moreover, a double exposure process has also been proposed in which a resist film is formed, and the resist film is then subjected to exposure twice or more, followed by development to form a resist pattern Like the double patterning process described above, this type of double exposure process is also capable of forming a resist pattern with a high level of resolution, and also has an advantage in that fewer number of steps is required than the above-mentioned double patterning process.

In a positive development process using a positive type, chemically amplified resist composition (i.e., a chemically amplified resist composition which exhibits increased alkali solubility in an alkali developing solution upon exposure) in combination with an alkali developing solution, as described above, the exposed portions of the resist film are dissolved and removed by an alkali developing solution to thereby form a resist pattern. The positive development process using a combination of a positive chemically amplified resist composition and an alkali developing solution is advantageous over a negative development process in which a negative type, chemically amplified resist composition is used in combination with an alkali developing solution in that the structure of the photomask can be simplified, a satisfactory contrast for forming an image can be easily obtained, and the characteristics of the formed resist pattern are excellent. For these reasons, currently, positive development process using a combination of a positive chemically amplified resist composition and an alkali developing solution is tended to be employed in the formation of an extremely fine resist pattern.

DOCUMENTS OF RELATED ART

Patent Documents

[Patent Document 1] Japanese Unexamined Patent Application, First Publication No. Hei 6-194847
[Patent Document 2] Japanese Unexamined Patent Application, First Publication No. 2003-241385

Non-Patent Documents

[Non-Patent Document 1] Proceedings of SPIE (U.S.), vol. 5754, pp. 119-128 (2005)
[Non-Patent Document 2] Proceedings of SPIE (U.S.), vol. 5256, pp. 985-994 (2003)
[Non-Patent Document 3] Proceedings of SPIE (U.S.), vol. 6153, pp. 1-19 (2006)

SUMMARY OF THE INVENTION

However, in the future, as further progress is made in lithography techniques and the potential application fields for lithography techniques continue to expand, improvements in various lithography properties will be required also in a positive development process that uses a combination of a positive chemically amplified resist composition and an alkali developing solution. For example, as a matter of course, improvement in the resolution and improvement in the sensitivity together with shortening of the wavelength (increasing the energy) of the exposure light source are required, but also, reducing the roughness which develop on the upper surface and side wall surfaces of the formed pattern is required. The roughness becomes the cause of defects in the shape of the resist pattern, and therefore, improvement thereof becomes more important as the pattern size becomes smaller. For example, roughness on the side wall surfaces of a pattern can cause various defects such as non-uniformity of the line width of line and space patterns, or distortions around the holes in hole patterns. Such defects adversely affect the formation of very fine semiconductor devices.

Further, in the conventional positive development process using an aqueous alkali solution (alkali developing solution) such as an aqueous solution of tetramethylammonium hydroxide (TMAH) as a developing solution, the swelling or collapse of resist patterns easily occurs due to the effects of water as the miniaturization of resist patterns progresses.

The present invention takes the above circumstances into consideration, with an object of providing a method of forming a resist pattern which can stably form a very fine resist pattern with favorable lithography properties by a positive development process.

As a result of intensive and extensive investigation, the inventors of the present invention discovered that by using a developing solution containing a polar organic solvent as the developing solution in the positive development process, the above object could be achieved, and they were therefore able to complete the present invention.

That is, a method of forming a resist pattern according to the present invention is a method of forming a resist pattern, including: forming a resist film on a substrate using a resist composition containing a base component (A) which exhibits increased solubility in an organic solvent under the action of acid and an acid generator component (B) which generates acid upon exposure; conducting exposure of the resist film; and patterning the resist film by positive development using a developing solution containing the organic solvent to form a resist pattern, wherein the base component (A) is a resin component (A1) containing a structural unit (a1) derived from an acrylate ester which may have the hydrogen atom bonded to the carbon atom on the α-position substituted with a substituent and contains an acid decomposable group which exhibits increased polarity by the action of acid, and the developing solution is a developing solution that contains a polar organic solvent but contains substantially no alkali components.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon groups, unless otherwise specified. The same applies for the alkyl group within an alkoxy group.

The term "alkylene group" includes linear, branched or cyclic divalent saturated hydrocarbon groups, unless otherwise specified.

A "halogenated alkyl group" is a group in which part or all of the hydrogen atoms of an alkyl group are substituted with a halogen atom, and a "halogenated alkylene group" is a group in which part or all of the hydrogen atoms of an alkylene group are substituted with a halogen atom. Examples of the halogen atom include a fluorine atom, a chlorine atom, a bromine atom and an iodine atom.

A "hydroxyalkyl group" is a group in which part or all of the hydrogen atoms within an alkyl group have been substituted with a hydroxyl group.

The term "structural unit" refers to a monomer unit that contributes to the formation of a polymeric compound (namely, a resin, polymer or copolymer).

The term "exposure" is used as a general concept that includes irradiation with any form of radiation.

According to the present invention, there is provided a method of forming a resist pattern which can stably form a very fine resist pattern with favorable lithography properties by a positive development process.

DETAILED DESCRIPTION OF THE INVENTION

Method of Forming a Resist Pattern

The method of forming a resist pattern according to the present invention includes: forming a resist film on a substrate using a resist composition containing a base component (A) which exhibits increased solubility in an organic solvent under the action of acid and an acid generator component (B) which generates acid upon exposure; conducting exposure of the aforementioned resist film; and patterning the aforementioned resist film by positive development using a developing solution containing the aforementioned organic solvent to form a resist pattern.

This method of forming a resist pattern is characterized in that a resin component (A1) containing a structural unit (a1) derived from an acrylate ester which may have the hydrogen atom bonded to the carbon atom on the α-position substituted with a substituent and contains an acid decomposable group which exhibits increased polarity by the action of acid is used as the aforementioned base component (A), and that a developing solution that contains a polar organic solvent but contains substantially no alkali components is used as the aforementioned developing solution.

In the resist composition, when radial rays are irradiated (when exposure is conducted), acid is generated from the acid generator component (B), and the solubility of the base component (A) in an organic solvent is increased by the action of the acid. Therefore, in the method of forming a resist pattern, by conducting selective exposure of a resist film formed by using the resist composition, the solubility of the exposed portions of the resist film in the aforementioned developing solution containing an organic solvent (hereafter, frequently referred to as an "organic developing solution") is increased, whereas the solubility of the unexposed portions in an organic developing solution is unchanged, and hence, a resist pattern can be formed by removing the exposed portions by positive development using the organic developing solution. The resist composition will be described later.

More specifically, the method of forming a resist pattern according to the present invention can be performed, for example, as follows.

Firstly, the resist composition is applied to a substrate using a spinner or the like, and a bake treatment (post applied bake (PAB)) is conducted at a temperature of 80 to 150° C. for 40 to 120 seconds, preferably 60 to 90 seconds, to form a resist film. Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds. The resulting resist film is subjected to developing treatment using an organic developing solution, preferably followed by rinsing with a rinse liquid containing an organic solvent, and then drying is conducted.

After the developing treatment or the rinsing, the developing solution or the rinse liquid remaining on the pattern can be removed by a treatment using a supercritical fluid.

If necessary, after the developing treatment, the rinsing or the treatment with a supercritical fluid, a bake treatment (post bake) may be conducted in order to remove any remaining organic solvent.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (triple-layer resist method).

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

In the present invention, the developing treatment is conducted using an organic developing solution that contains a polar organic solvent but contains substantially no alkali components.

In the present invention, the expression "contains substantially no alkaline components" means that the concentration of the alkali components as the developing solution for dissolving the base component (A) based on the total amount of the organic developing solution is preferably 100 ppm or less as the upper limit thereof. The upper limit thereof is more preferably 10 ppm or less, and still more preferably 1.0 ppm or less. The concentration of the alkali components based on the total amount of the organic developing solution may be 0 ppm as the lower limit thereof. Further, no alkali components may be contained as the developing solution for dissolving the base component (A). Examples of the alkali components include the components contained in the alkali developing solution such as tetramethylammonium hydroxide (TMAH) and tetrabutylammonium hydroxide (TBAH).

Examples of the polar organic solvents include alcohol-based solvents, ketone-based solvents, ester-based solvents, amide-based solvents, ether-based solvents and nitrile-based solvents, and among these, alcohol-based solvents are particularly desirable since high resolution can be easily achieved.

An alcohol-based solvent is an organic solvent containing an alcoholic hydroxyl group within the structure thereof, and an "alcoholic hydroxyl group" refers to a hydroxyl group bonded to a carbon atom of an aliphatic hydrocarbon group.

Examples of alcohol-based solvents include monohydric alcohols, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and 3-methoxy-1-butanol; glycol-based solvents, such as ethylene glycol, diethylene glycol and triethylene glycol; and glycol ether-based solvents containing a hydroxyl group, such as ethylene glycol monomethyl ether, propylene glycol monomethyl ether, diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether and propylene glycol monophenyl ether.

Of these, monohydric alcohols are preferred, monohydric alcohols of 1 to 5 carbon atoms are more preferred, and methyl alcohol, ethyl alcohol and isopropyl alcohol are particularly preferred.

As the polar organic solvent contained in the organic developing solution, a single type of solvent may be used alone, or two or more types of solvents may be used in combination.

The amount of the polar organic solvent contained in the organic developing solution based on the total amount of the organic developing solution is preferably at least 50% by weight, more preferably 80% by weight or more, and particularly preferably 100% by weight, in terms of the effects of the present invention, so that the organic developing solution is composed entirely of the polar organic solvent. Of the various possibilities, the organic developing solution is preferably composed of an alcohol-based solvent.

The organic developing solution may contain a component other than the polar organic solvent. Examples of the components other than the polar organic solvents include non-polar organic solvents such as hydrocarbon-based solvents; water, and surfactants.

Examples of hydrocarbon-based solvents include aliphatic hydrocarbon-based solvents, such as pentane, hexane, octane, decane, 2,2,4-trimethylpentane, 2,2,3-trimethylhexane, perfluorohexane and perfluoroheptane; and aromatic hydrocarbon-based solvents, such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene and dipropylbenzene. Among these examples, an aromatic hydrocarbon-based solvent is preferable.

Although there are no particular limitations on the surfactants which may be contained in the organic developing solution, for example, ionic or nonionic, fluorine-based solvents and/or silicon-based surfactants can be used.

Examples of commercially available surfactants that are usable include fluorine-based surfactants or silicon-based surfactants such as F Top EF301, EF303 (manufactured by Shinakita Kasei K.K.), Florad FC430, FC431 (manufactured by Sumitomo 3M Limited), Megafac F171, F173, F176, F189, R08 (manufactured by DIC Corporation), Surflon S-382, SC101, SC102, SC103, SC104, SC105, SC106 (manufactured by Asahi Glass Co., Ltd.) and Troysol S-366 (Troy Chemical Industries, Inc.). Further, polysiloxane polymer KP-341 (manufactured by Shin-Etsu Chemical Co., Ltd.) can also be used as a silicon-based surfactant.

Further, other than the aforementioned conventional surfactants, there can be used a surfactant containing a polymer having a fluoroaliphatic group derived from a fluoroaliphatic compound produced by a telomerization method (telomer method) or an oligomerization method (oligomer method). The fluoroaliphatic compound can be synthesized by a method described in Japanese Unexamined Patent Application, First Publication No. 2002-90991.

As the polymer containing a fluoroaliphatic group, a copolymer of a monomer containing a fluoroaliphatic group and a (poly(oxyalkylene)) acrylate and/or (poly(oxyalkylene)) methacrylate is preferable. The copolymer may be either a random copolymer or a block copolymer. Examples of the poly(oxyalkylene) group include a poly(oxyethylene) group, a poly(oxypropylene) group and a poly(oxybutylene) group. Alternatively, a unit in which different types of alkylene chains exist within the same chain may be used, such as a poly(block linkage of oxyethylene, oxypropylene and oxyethylene) or a poly(block linkage of oxyethylene and oxypropylene). Furthermore, the copolymer of a monomer having a fluoroaliphatic group and a (poly(oxyalkylene))acrylate (or methacrylate) may not only be a binary copolymer, but may be a ternary or higher copolymer in which 2 or more different types of monomers having a fluoroaliphatic group or 2 or more different types of (poly(oxyalkylene))acrylate (or methacrylate) have been copolymerized together.

Examples of such surfactants which are commercially available include Megafac F178, Megafac F470, Megafac F473, Megafac F475, Megafac F476 and Megafac F472 (manufactured by DIC Corporation). Further examples include a copolymer containing an acrylate (or a methacrylate) having a $C_6F_{13}$ group and a (poly(oxyalkylene)) acrylate (or methacrylate), a copolymer containing an acrylate (or a methacrylate) having a $C_6F_{13}$ group, a (poly(oxyethylene)) acrylate (or methacrylate) and a (poly(oxypropylene)) acrylate (or methacrylate), a copolymer containing an acrylate (or a methacrylate) having a $C_8F_{17}$ group and a (poly(oxyalkylene)) acrylate (or methacrylate), and a copolymer containing an acrylate (or a methacrylate) having a $C_8F_{17}$ group, a (poly(oxyethylene)) acrylate (or methacrylate) and a (poly(oxypropylene)) acrylate (or methacrylate).

As the surfactant, a nonionic surfactant is preferable, and a fluorine-based surfactant or a silicon-based surfactant is more preferable.

When a surfactant is added, the amount thereof based on the total amount of the organic developing solution is generally 0.001 to 5% by weight, preferably 0.005 to 2% by weight, and more preferably 0.01 to 0.5% by weight.

The development treatment using the organic developing solution can be performed by a conventional developing method. Examples of the developing methods include a method in which the substrate is immersed in the developing solution for a certain period of time (a dipping method), a method in which the developing solution is accumulated by surface tension to remain still at the surface of the substrate for a certain period of time (puddle method), a method in which the developing solution is sprayed onto the surface of the substrate (spray method), and a method in which the developing solution is continuously ejected from a developing solution ejecting nozzle while scanning the substrate at a constant rate so as to apply the developing solution onto the substrate which is rotating at a constant rate (dynamic dispensing method).

After the developing treatment described above and before drying, it is preferable to perform a rinse treatment using a rinse liquid containing an organic solvent. By performing a rinse treatment, an excellent pattern can be formed.

As the organic solvent used in the rinse liquid, any of the organic solvents which hardly dissolves the resist pattern can be appropriately selected for use. In general, at least one type of solvent selected from the group consisting of hydrocarbon-based solvents, ketone-based solvents, ester-based solvents, alcohol-based solvents, amide-based solvents and ether-based solvents is used. Of these, at least one type of solvent selected from the group consisting of hydrocarbon-based solvents, ketone-based solvents, ester-based solvents, alcohol-based solvents and amide-based solvents is preferable, more preferably at least one type of solvent selected from the group consisting of alcohol-based solvents and ester-based solvents, and an alcohol-based solvent is particularly desirable.

These organic solvents may be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

(Resist Composition)

In the method of forming a resist pattern according to the present invention, a resist composition containing a base component (A) (hereafter, referred to as "component (A)") which exhibits increased solubility in an organic solvent under the action of acid and an acid generator component (B) (hereafter, referred to as "component (B)") which generates acid upon exposure is used.

<Component (A)>

In the present invention, the term "base component" refers to an organic compound capable of forming a film.

As the base component, an organic compound having a molecular weight of 500 or more is typically used. When the organic compound has a molecular weight of 500 or more, the organic compound exhibits a satisfactory film-forming ability, and a resist pattern of nano level can be easily formed.

The "organic compound having a molecular weight of 500 or more" is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any polymeric compound which has a molecular weight of 1,000 or more is generally used. In the present description and claims, the term "polymeric compound" refers to a polymer having a molecular weight of 1,000 or more, and the polymeric compound is frequently referred to as a "resin".

With respect to a polymeric compound, the "molecular weight" is the weight average molecular weight in terms of the polystyrene equivalent value determined by gel permeation chromatography (GPC).

[Resin Component (A1)]

In the method of forming a resist pattern according to the present invention, the component (A) contains a resin component (A1) (hereafter, referred to as "component (A1)") containing a structural unit (a1) derived from an acrylate ester which may have the hydrogen atom bonded to the carbon atom on the α-position substituted with a substituent and contains an acid decomposable group which exhibits increased polarity by the action of acid.

In addition to the structural unit (a1), it is preferable that the component (A1) further include at least one type of structural unit selected from the group consisting of a structural unit (a2) derived from an acrylate ester which may have the hydrogen atom bonded to the carbon atom on the α-position substituted with a substituent and contains a lactone-containing cyclic group and a structural unit (a0) derived from an acrylate ester which may have the hydrogen atom bonded to the carbon atom on the α-position substituted with a substituent and contains a —SO$_2$— containing cyclic group.

Further, in addition to the structural unit (a1) or in addition to the structural unit (a1) and the structural unit (a2) and/or structural unit (a0), it is preferable that the component (A1)

also include a structural unit (a3) derived from an acrylate ester which may have the hydrogen atom bonded to the carbon atom on the α-position substituted with a substituent and contains a polar group-containing aliphatic hydrocarbon group.

In the present descriptions and the claims, the expression "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2=CH-COOH$) has been substituted with an organic group.

With respect to the acrylate ester, a hydrogen atom bonded to the carbon atom on the α-position may be substituted with a substituent. The substituent for substituting the hydrogen atom bonded to the carbon atom on the α-position is an atom or group other than a hydrogen atom, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, an acrylate ester in which a hydrogen atom bonded to the carbon atom on the α-position has been substituted with a substituent is sometimes referred to as an α-substituted acrylate ester. Further, acrylate esters and α-substituted acrylate esters are sometimes collectively referred to as (α-substituted) acrylate esters.

With respect to the α-substituted acrylate esters, the alkyl group as a substituent on the α-position is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group and a neopentyl group.

Further, specific examples of the halogenated alkyl group as a substituent on the α-position include groups in which some or all of the hydrogen atoms of the aforementioned "alkyl group as a substituent on the α-position" have been substituted with halogen atoms. Examples of the halogen atom include a fluorine atom, a chlorine atom, a bromine atom and an iodine atom, and a fluorine atom is particularly desirable.

It is preferable that a hydrogen atom, an alkyl group of 1 to 5 carbon atoms or a halogenated alkyl group of 1 to 5 carbon atoms is bonded to the α-position of the α-substituted acrylate esters, and more preferably a hydrogen atom, an alkyl group of 1 to 5 carbon atoms or a fluorinated alkyl group of 1 to 5 carbon atoms. In terms of industrial availability, a hydrogen atom or a methyl group is the most desirable.

(Structural Unit (a1))

The structural unit (a1) is a structural unit derived from an acrylate ester which may have the hydrogen atom bonded to the carbon atom on the α-position substituted with a substituent and contains an acid decomposable group which exhibits increased polarity by the action of acid.

The term "acid decomposable group" refers to a group exhibiting acid decomposability in which at least a part of the bond within the structure of this acid decomposable group may be cleaved by the action of acid generated from the component (B) upon exposure.

Examples of acid decomposable groups which exhibit increased polarity by the action of an acid include groups which are decomposed by the action of an acid to form a polar group.

Examples of the polar group include a carboxy group, a hydroxyl group, an amino group and a sulfo group ($-SO_3H$). Among these, a polar group containing —OH in the structure thereof (hereafter, sometimes referred to as "OH-containing polar group") is preferable, a carboxy group or a hydroxyl group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

An "acid dissociable group" is a group exhibiting acid dissociability in which at least the bond between the acid dissociable group and the atom adjacent to this acid dissociable group may be cleaved by the action of acid generated from the component (B) upon exposure. It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. In the present invention, because of this increase in the polarity, the solubility in a developing solution containing a polar organic solvent (organic developing solution) is relatively increased.

The acid dissociable group is not particularly limited, and any of the groups that have been conventionally proposed as acid dissociable groups for the base resins of chemically amplified resists can be used. Generally, groups that form either a cyclic or chain-like tertiary alkyl ester with the carboxyl group of the (meth)acrylic acid, and acetal-type acid dissociable groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group ($-C(=O)-O-$). In this tertiary alkyl ester, the action of acid causes cleavage of the bond between the oxygen atom and the tertiary carbon atom, thereby forming a carboxy group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, acid dissociable groups and aliphatic cyclic group-containing acid dissociable groups.

Here, the term "aliphatic branched" refers to a branched structure having no aromaticity. The "aliphatic branched, acid dissociable group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable group, for example, a group represented by the formula $-C(R^{71})(R^{72})(R^{73})$ can be given (in the formula, each of $R^{71}$ to $R^{73}$ independently represents a linear alkyl group of 1 to 5 carbon atoms). The group represented by the formula $-C(R^{71})(R^{72})(R^{73})$ preferably has 4 to 8 carbon atoms, and specific examples include a tert-butyl group, a 2-methyl-2-butyl group, a 2-methyl-2-pentyl group and a 3-methyl-3-pentyl group. Among these, a tert-butyl group is particularly desirable.

The term "aliphatic cyclic group" refers to a monocyclic group or polycyclic group that has no aromaticity.

In the "aliphatic cyclic group-containing acid dissociable group", the "aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated.

The aliphatic cyclic group may be either a monocyclic group or a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group, may be used. Specific examples of aliphatic cyclic hydrocarbon groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Further, in these aliphatic cyclic hydrocarbon groups, part of the carbon atoms constituting the ring may be replaced with an ether group (—O—).

Examples of aliphatic cyclic group-containing acid dissociable groups include (i) a monovalent aliphatic cyclic group in which a substituent (a group or an atom other than hydrogen) is bonded to the carbon atom on the ring skeleton to which an atom adjacent to the acid dissociable group (e.g., "—O—" within "—C(=O)—O— group") is bonded to form a tertiary carbon atom; and (ii) a group which has a branched alkylene group containing a tertiary carbon atom, and a monovalent aliphatic cyclic group to which the tertiary carbon atom is bonded.

In the group (i), as the substituent bonded to the carbon atom to which an atom adjacent to the acid dissociable group is bonded on the ring skeleton of the aliphatic cyclic group, an alkyl group can be mentioned. Examples of the alkyl group include the same groups as those represented by $R^{14}$ in formulas (I-1) to (1-9) described later.

Specific examples of the group (i) include groups represented by general formulas (I-1) to (1-9) shown below.
Specific examples of the group (ii) include groups represented by general formulas (2-1) to (2-6) shown below.

[Chemical Formula 1]

(1-1)

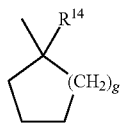

(1-2)

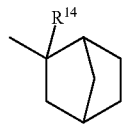

(1-3)

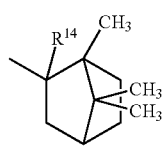

(1-4)

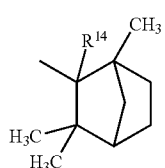

(1-5)

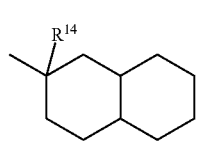

(1-6)

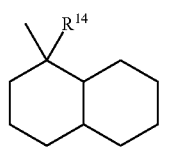

(1-7)

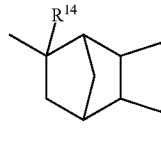

(1-8)

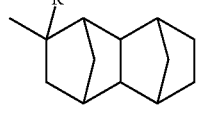

(1-9)

In the formulas above, $R^{14}$ represents an alkyl group; and g represents an integer of 0 to 8.

[Chemical Formula 2]

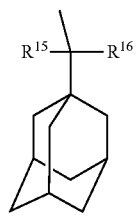

(2-1)

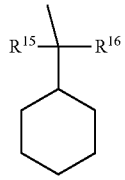

(2-2)

-continued (2-3)
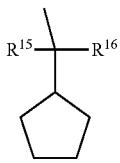

(2-4)
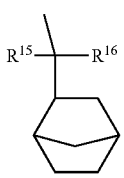

(2-5)
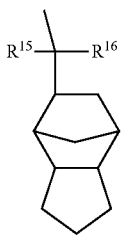

(2-6)
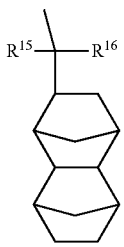

In the formulas above, each of $R^{15}$ and $R^{16}$ independently represents an alkyl group.

In formulas (1-1) to (1-9), the alkyl group for $R^{14}$ may be linear, branched or cyclic, and is preferably linear or branched.

The linear alkyl group preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5 carbon atoms. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably an integer of 1 to 3, and still more preferably 1 or 2.

In formulas (2-1) to (2-6), as the alkyl group for $R^{15}$ and $R^{16}$, the same alkyl groups as those for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable group" generally substitutes a hydrogen atom at the terminal of an OH-containing polar group such as a carboxy group or hydroxyl group, so as to be bonded with an oxygen atom. When acid is generated upon exposure, the generated acid acts to break the bond between the acetal-type acid dissociable group and the oxygen atom to which the acetal-type, acid dissociable group is bonded, thereby forming an OH-containing polar group such as a carboxy group or a hydroxyl group.

Examples of acetal-type acid dissociable groups include groups represented by general formula (p1) shown below (acid dissociable group (p1)).

[Chemical Formula 3]

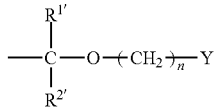
(p1)

In the formula, each of $R^{1\prime}$ and $R^{2\prime}$ independently represents a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1), n is preferably an integer of 0 to 2, more preferably 0 or 1, and most preferably 0.

As the alkyl group for $R^{1\prime}$ and $R^{2\prime}$, the same alkyl groups as those described above as the substituent which may be bonded to the carbon atom on the α-position of the aforementioned α-substituted acrylate ester can be used, although a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable group (p1) is a group represented by general formula (p1-1) shown below.

[Chemical Formula 4]

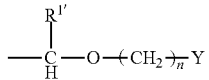
(p1-1)

In the formula, $R^{1\prime}$, n and Y are the same as defined above.

As the alkyl group for Y, the same alkyl groups as those described above as the substituent which may be bonded to the carbon atom on the α-position of the aforementioned α-substituted acrylate ester can be used.

As the aliphatic cyclic group for Y, any of the aliphatic monocyclic/polycyclic groups which have been proposed for conventional ArF resists and the like can be appropriately selected for use. For example, the same aliphatic cyclic groups as those described above in connection with the "acid dissociable group containing an aliphatic cyclic group" can be used.

Further, as the acetal-type, acid dissociable group, groups represented by general formula (p2) shown below can also be used.

[Chemical Formula 5]

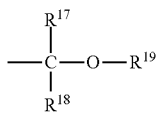
(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

More specific examples of the structural unit (a1) include a structural unit represented by general formula (a1-0-1) shown below and a structural unit represented by general formula (a1-0-2) shown below.

[Chemical Formula 6]

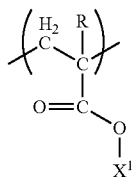
(a1-0-1)

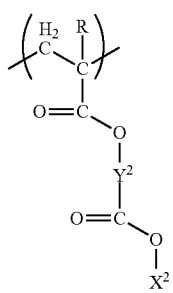
(a1-0-2)

In the formulas, R represents a hydrogen atom, an alkyl group of 1 to 5 carbon atoms or a halogenated alkyl group of 1 to 5 carbon atoms; $X^1$ represents an acid dissociable group; $Y^2$ represents a divalent linking group; and $X^2$ represents an acid dissociable group.

In general formula (a1-0-1), the alkyl group and the halogenated alkyl group for R are respectively the same as defined for the alkyl group and the halogenated alkyl group for the substituent which may be bonded to the carbon atom on the α-position of the aforementioned α-substituted acrylate ester. R is preferably a hydrogen atom, an alkyl group of 1 to 5 carbon atoms or a fluorinated alkyl group of 1 to 5 carbon atoms, and most preferably a hydrogen atom or a methyl group.

$X^1$ is not particularly limited as long as it is an acid dissociable group. Examples thereof include the aforementioned tertiary alkyl ester-type acid dissociable groups and acetal-type acid dissociable groups, and tertiary alkyl ester-type acid dissociable groups are preferable.

In general formula (a1-0-2), R is the same as defined above.
$X^2$ is the same as defined for $X^1$ in general formula (a1-0-1).

The divalent linking group for $Y^2$ is not particularly limited, and preferable examples thereof include a divalent hydrocarbon group which may have a substituent and a divalent linking group containing a hetero atom.

A hydrocarbon "has a substituent" means that part or all of the hydrogen atoms within the hydrocarbon group is substituted with a substituent (a group or an atom other than hydrogen).

The hydrocarbon group may be either an aliphatic hydrocarbon group or an aromatic hydrocarbon group.

An "aliphatic hydrocarbon group" refers to a hydrocarbon group that has no aromaticity.

The aliphatic hydrocarbon group as the divalent hydrocarbon group for $Y^2$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—($CH_2$)$_2$—], a trimethylene group [—($CH_2$)$_3$—], a tetramethylene group [—($CH_2$)$_4$—] and a pentamethylene group [—($CH_2$)$_5$—].

As the branched aliphatic hydrocarbon group, branched alkylene groups are preferred, and specific examples include various alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (=O).

Examples of the aliphatic hydrocarbon group containing a ring in the structure thereof include alicyclic hydrocarbon groups (groups in which two hydrogen atoms have been removed from an aliphatic hydrocarbon ring), groups in which this type of alicyclic hydrocarbon group is bonded to the terminal of a linear or branched aliphatic hydrocarbon group, or groups in which this type of alicyclic hydrocarbon group is interposed within the chain of a linear or branched aliphatic hydrocarbon group. Examples of the linear or branched aliphatic hydrocarbon group include the same aliphatic hydrocarbon groups as those described above.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic alicyclic hydrocarbon group, a group in which two hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which two hydrogen atoms have been removed from a polycycloalkane is preferable, and the polycycloalkane preferably has 7 to 12 carbon atoms. Specific examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group having an aromatic ring.

The aromatic hydrocarbon group as the divalent hydrocarbon group for $Y^2$ preferably has 3 to 30 carbon atoms, more preferably 5 to 30 carbon atoms, still more preferably 5 to 20 carbon atoms, still more preferably 6 to 15 carbon atoms, and most preferably 6 to 10 carbon atoms. Here, the number of carbon atoms within a substituent(s) is not included in the number of carbon atoms of the aromatic hydrocarbon group.

Specific examples of the aromatic rings included in the aromatic hydrocarbon groups, include aromatic hydrocarbon rings such as benzene, biphenyl, fluorene, naphthalene, anthracene and phenanthrene; and aromatic heterocycles in which part of the carbon atoms constituting the aforementioned aromatic hydrocarbon ring has been substituted with a hetero atom. Examples of the hetero atoms within aromatic heterocycles include an oxygen atom, a sulfur atom and a nitrogen atom.

Specific examples of the aromatic hydrocarbon groups include groups in which two hydrogen atoms have been removed from the aforementioned aromatic hydrocarbon ring (arylene groups); and groups in which one of the hydrogen atoms of a group (i.e., an aryl group in which one hydrogen atom has been removed from the aforementioned aromatic hydrocarbon ring) has been substituted with an alkylene group (for example, groups in which one hydrogen atom has been further removed from the aryl group within an arylalkyl group, such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic hydrocarbon ring within the aromatic hydrocarbon group may be substituted with a substituent. Examples of the substituent include an alkyl group, an alkoxy group, a halogen atom, a halogenated alkyl group, a hydroxyl group and an oxygen atom (=O).

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, an ethoxy group, a n-propoxy group, an iso-propoxy group, a n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group as the substituent include groups in which part or all of the hydrogen atoms within the aforementioned alkyl groups has been substituted with the aforementioned halogen atoms.

With respect to a "divalent linking group containing a hetero atom", a hetero atom is an atom other than carbon and hydrogen, and examples thereof include an oxygen atom, a nitrogen atom, a sulfur atom and a halogen atom.

Examples of a divalent linking group containing a hetero atom include —O—, —C(=O)—O—, —C(=O)—, —O—C(=O)—O—, —C(=O)—NH—, —NH— (H may be substituted with a substituent such as an alkyl group, an acyl group or the like), —S—, —S(=O)$_2$—, —S(=O)$_2$—O—, —NH—C(=O)—, =N—, groups represented by general formula —$Y^{21}$—O—$Y^{22}$—, —[$Y^{21}$—C(=O)—O]$_{m'}$—$Y^{22}$— or —$Y^{21}$—O—C(=O)—$Y^{22}$— [in the formulas, each of $Y^{21}$ and $Y^{22}$ independently represents a divalent hydrocarbon group which may have a substituent, 0 represents an oxygen atom, and m' represents an integer of 0 to 3].

When $Y^2$ represents —NH—, this H may be substituted with a substituent such as an alkyl group or an acyl group. The substituent (an alkyl group, an acyl group or the like) preferably has 1 to 10 carbon atoms, more preferably 1 to 8 carbon atoms, and most preferably 1 to 5 carbon atoms.

In formulas —$Y^{21}$—O—$Y^{22}$—, —$[Y^{21}$—C('O)—O$]_{m'}$—$Y^{22}$— and —$Y^{21}$—O—C(=O)—$Y^{22}$—, each of $Y^{21}$ and $Y^{22}$ independently represents a divalent hydrocarbon group which may have a substituent. Examples of the divalent hydrocarbon groups include the same groups as those described above for the "divalent hydrocarbon group which may have a substituent" usable as $Y^2$.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —$[Y^{21}$—C(=O)—O$]_{m'}$—$Y^{22}$—, m' represents an integer of 0 to 3, preferably an integer of 0 to 2, more preferably 0 or 1, and most preferably 1. In other words, it is particularly desirable that the group represented by the formula —$[Y^{21}$—C(=O)—O$]_{m'}$—$Y^{22}$— be a group represented by the formula —$Y^{21}$—C(=O)—O—$Y^{22}$—. Of these, groups represented by the formula —$(CH_2)_{a'}$—C(=O)—O—$(CH_2)_{b'}$— are preferred. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking groups containing a hetero atom, linear groups containing an oxygen atom as a hetero atom, e.g., groups containing an ether bond or ester bond are preferred, and groups represented by the above formula —$Y^{21}$—O—$Y^{22}$—, —$[Y^{21}$—C(=O)—O$]_{m'}$—$Y^{22}$— or —$Y^{21}$—O—C(=)—$Y^{22}$— are more preferred.

Of the various possibilities described above, as the divalent linking group for $Y^2$, a linear or branched alkylene group, a divalent alicyclic hydrocarbon group or a divalent linking group containing a hetero atom is particularly desirable. Among these, a linear or branched alkylene group or a divalent linking group containing a hetero atom is more preferable.

Specific examples of the structural units represented by the above general formulas (a1-0-1) and (a1-0-2) include structural units represented by general formulas (a1-1) to (a1-4) shown below.

[Chemical Formula 7]

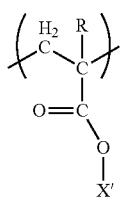
(a1-1)

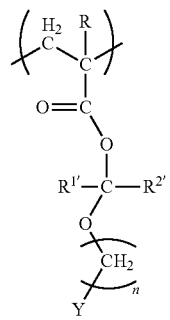
(a1-2)

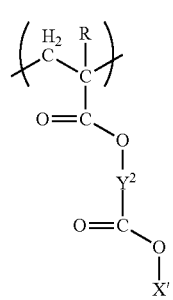
(a1-3)

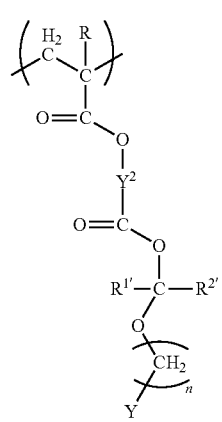
(a1-4)

In the formulas, R, $R^{1'}$, $R^{2'}$, n, Y and $Y^2$ are the same as defined above; and X' represents a tertiary alkyl ester-type acid dissociable group.

In the formulas, the tertiary alkyl ester-type acid dissociable group for X' include the same tertiary alkyl ester-type acid dissociable groups as those described above.

As $R^{1'}$, $R^{2'}$, n and Y, the same as those defined for $R^{1'}$, $R^{2'}$, n and Y in general formula (p1) described above in connection with the "acetal-type acid dissociable group" can be used.

As examples of $Y^2$, the same groups as those described above for $Y^2$ in general formula (a1-0-2) can be given.

Specific examples of structural units represented by general formula (a1-1) to (a1-4) are shown below.

In the formulas shown below, $R^\alpha$ represents a hydrogen atom, a methyl group or a trifluoromethyl group.
[Chemical Formula 8]
(a1-1-1)
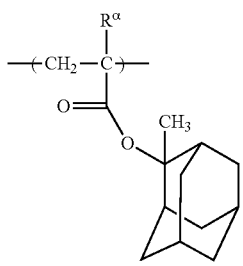
(a1-1-2)
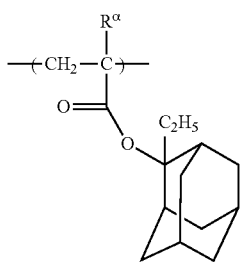
(a1-1-3)
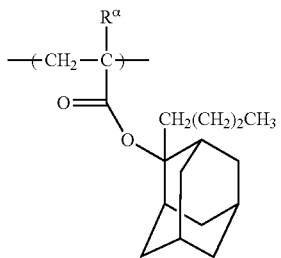
(a1-1-4)
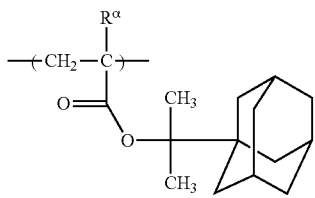
(a1-1-5)
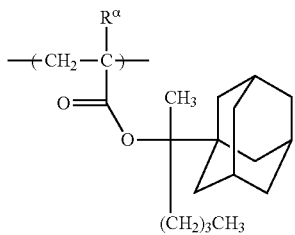
(a1-1-6)
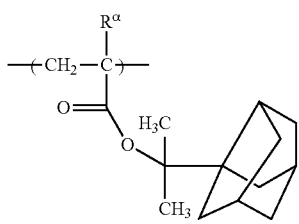
(a1-1-7)
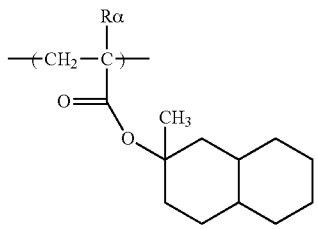
(a1-1-8)
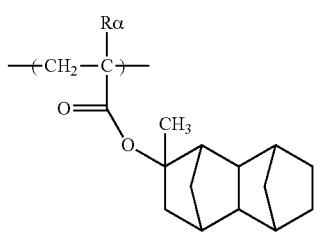
(a1-1-9)
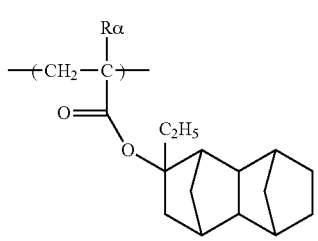
[Chemical Formula 9]
(a1-1-10)
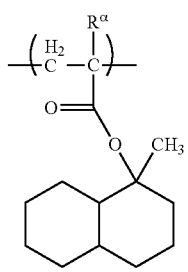
(a1-1-11)
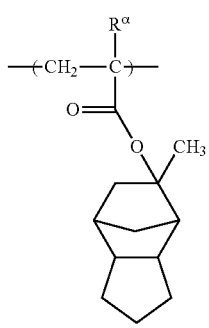
(a1-1-12)
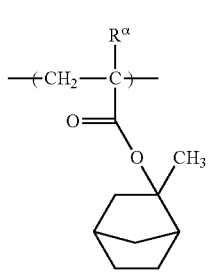

(a1-1-13) 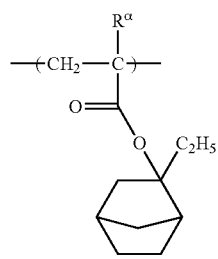
(a1-1-14) 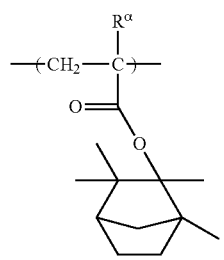
(a1-1-15) 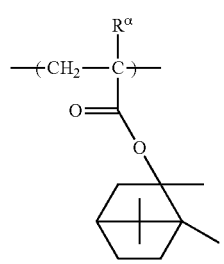
(a1-1-16) 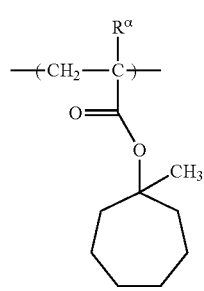
(a1-1-17) 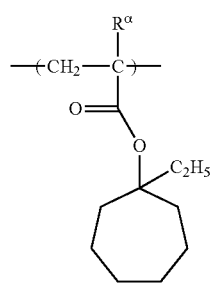
(a1-1-18) 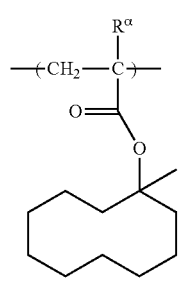
(a1-1-19) 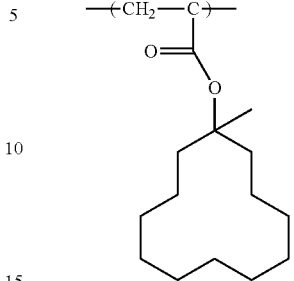
(a1-1-20) 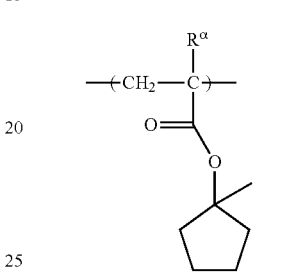
(a1-1-21) 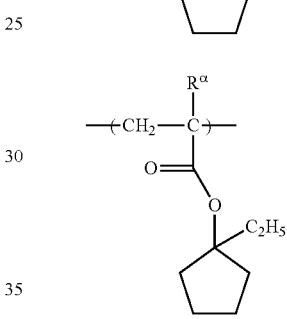
[Chemical Formula 10]
(a1-1-22) 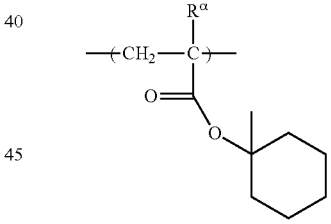
(a1-1-23) 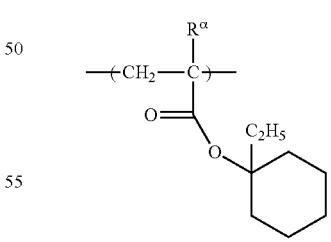
(a1-1-24) 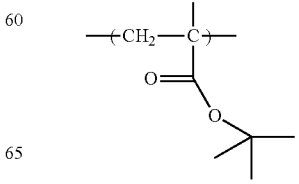

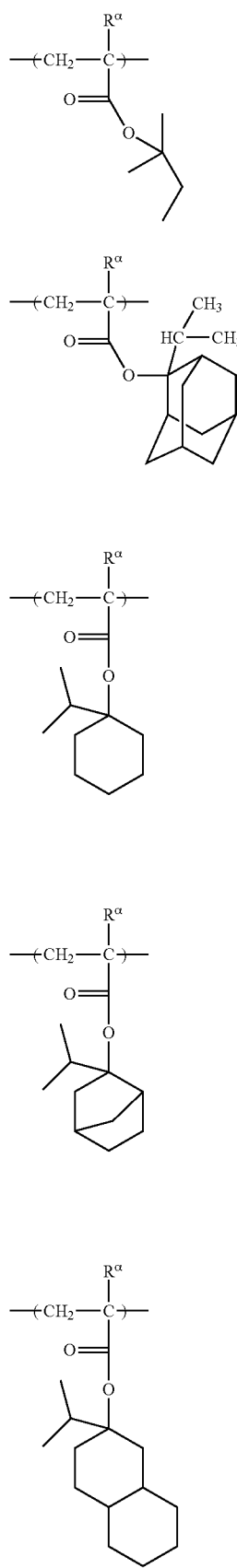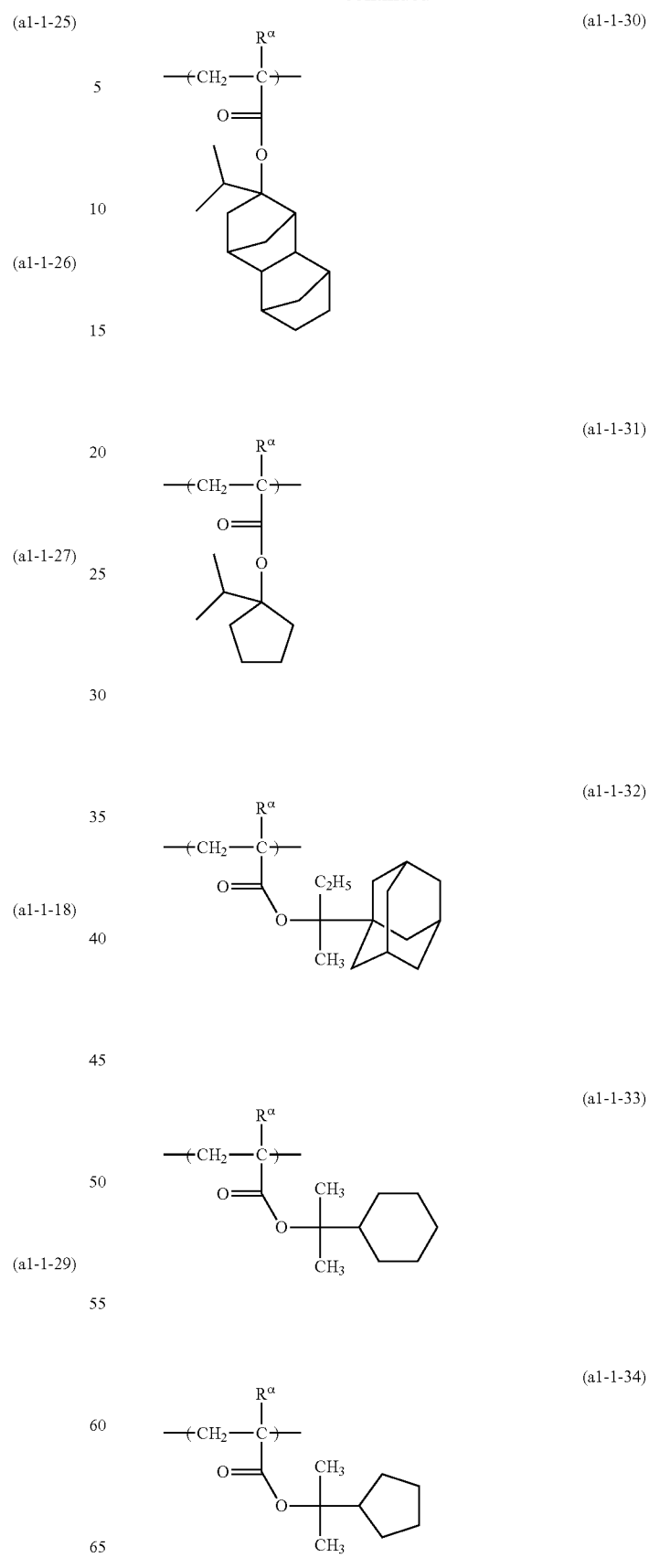

[Chemical Formula 11]
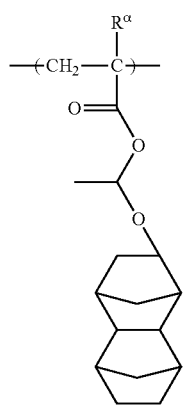 (a1-2-1)
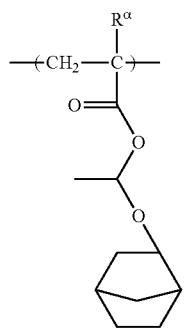 (a1-2-2)
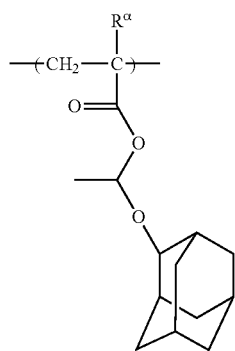 (a1-2-3)
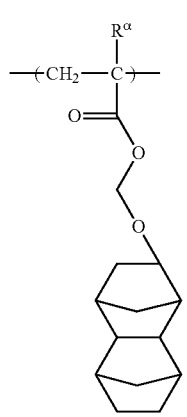 (a1-2-4)
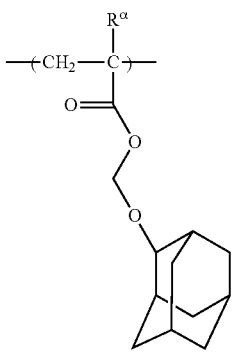 (a1-2-5)
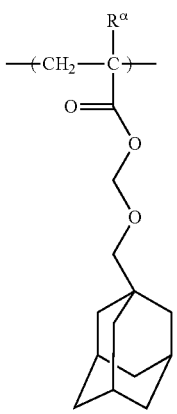 (a1-2-7)
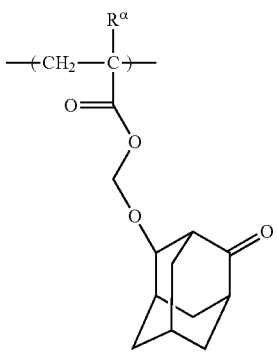 (a1-2-8)
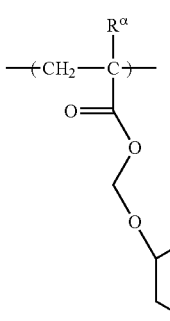 (a1-2-9)

(a1-2-10) 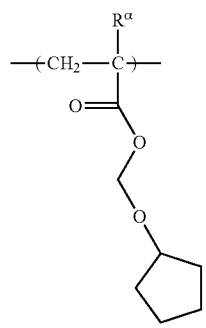
(a1-2-11) 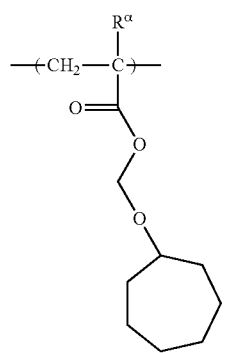
(a1-2-12) 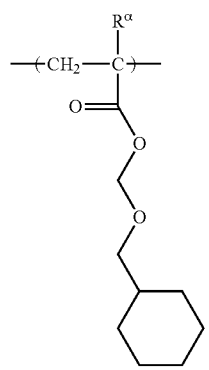
(a1-2-13) 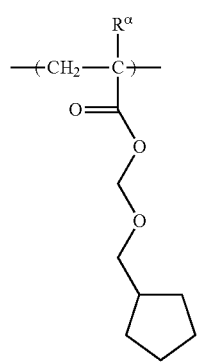
(a1-2-14) 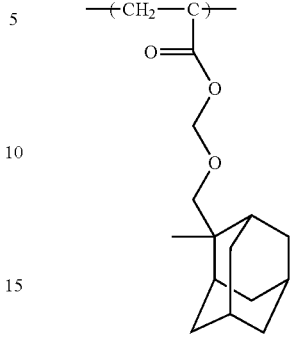
(a1-2-15) 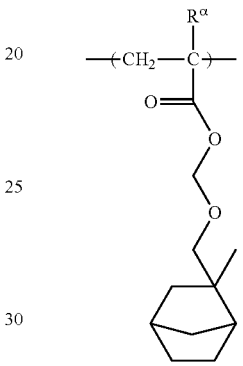
(a1-2-16) 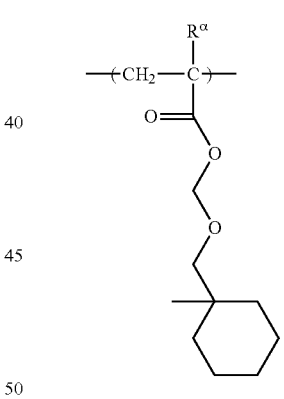
(a1-2-17) 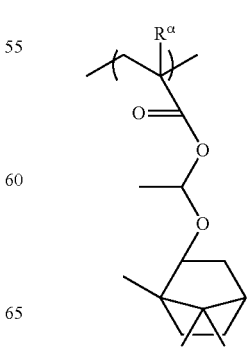

(a1-2-18)
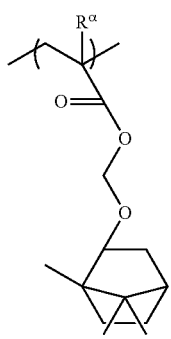
(a1-2-19)
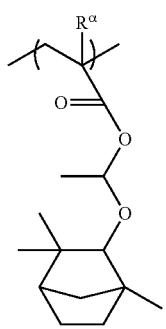
(a1-2-20)
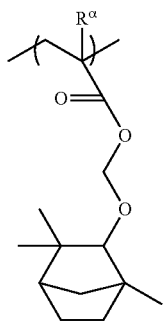
(a1-2-21)
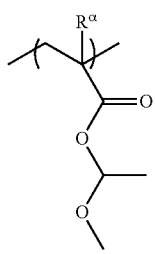
(a1-2-22)
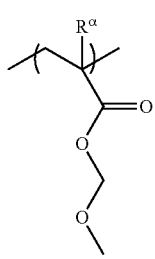
(a1-2-23)
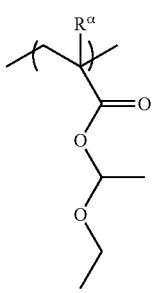
(a1-2-24)
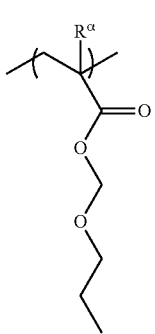
[Chemical Formula 12]
(a1-3-1)
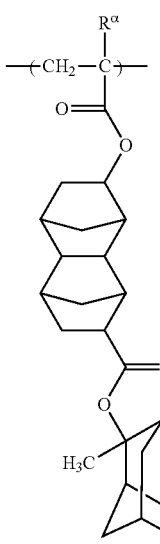

(a1-3-2)
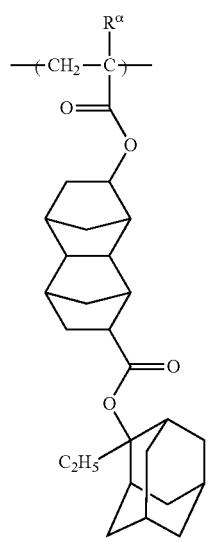
(a1-3-6)
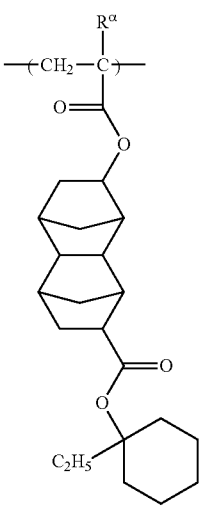
(a1-3-3)
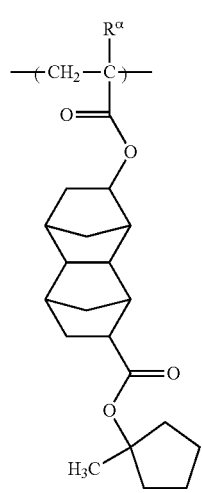
(a1-3-7)
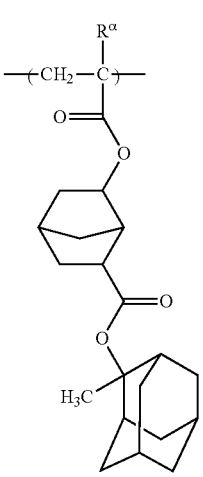
(a1-3-5)
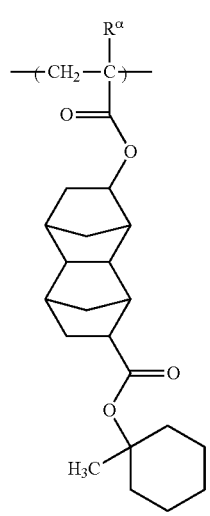
(a1-3-8)
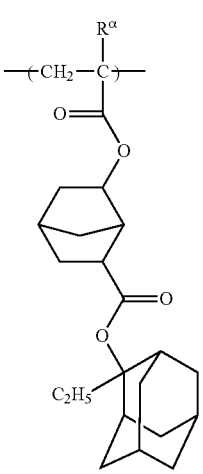

(a1-3-9)
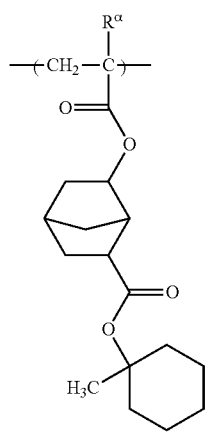
(a1-3-12)
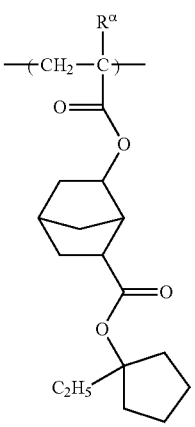
(a1-3-10)
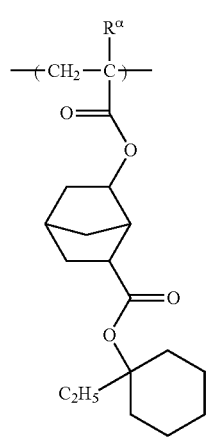
(a1-3-13)
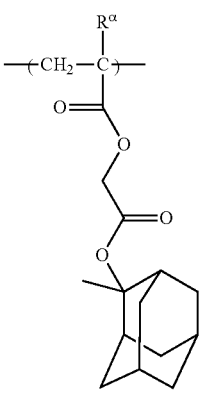
(a1-3-14)
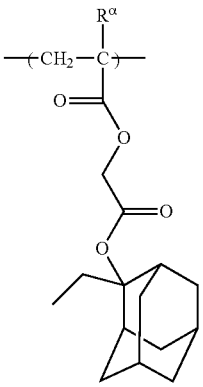
(a1-3-11)
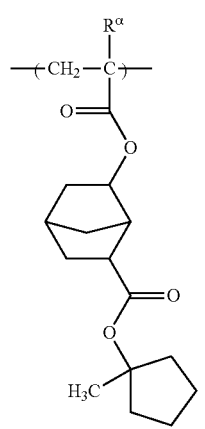
(a1-3-15)
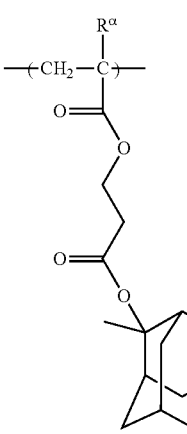

(a1-3-16)
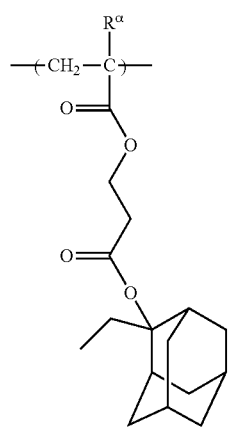
(a1-3-17)
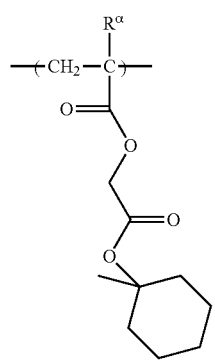
(a1-3-18)
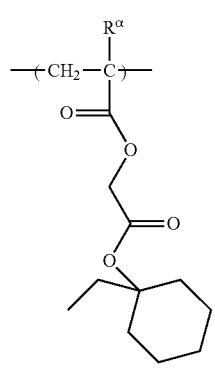
[Chemical Formula 13]
(a1-3-19)
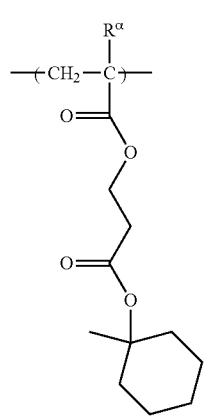
(a1-3-20)
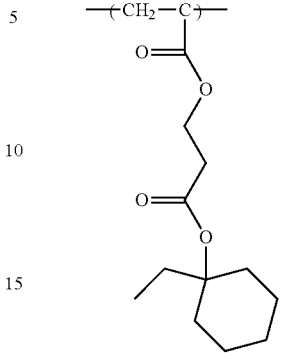
(a1-3-21)
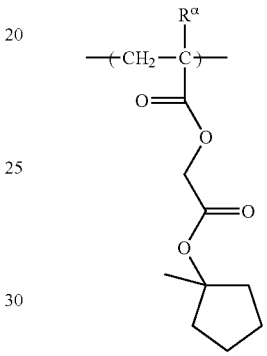
(a1-3-22)
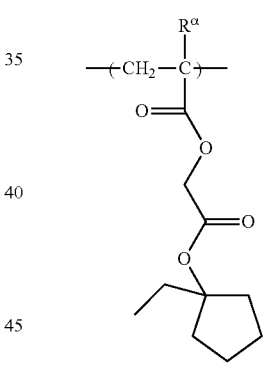
(a1-3-23)
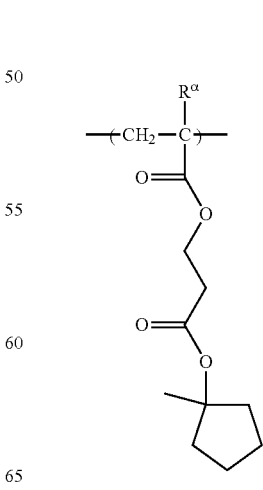

(a1-3-24)
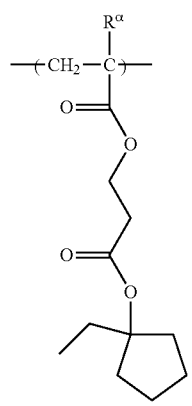
[Chemical Formula 14]
(a1-3-25)
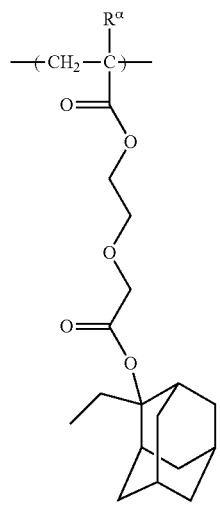
(a1-3-26)
(a1-3-27)
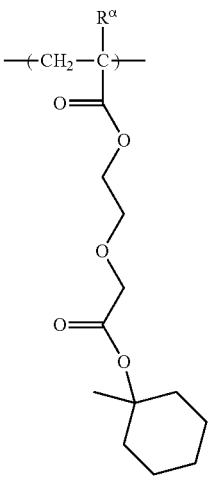
(a1-3-28)
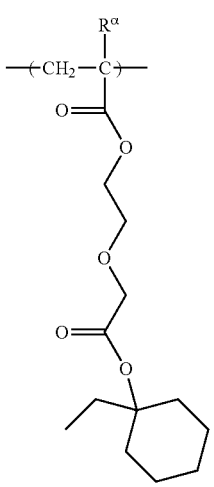
(a1-3-29)
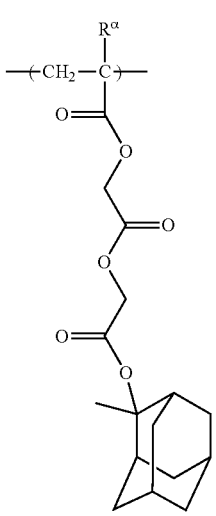

(a1-3-30)
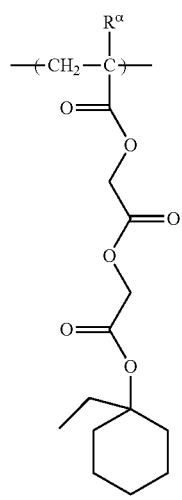
(a1-3-31)
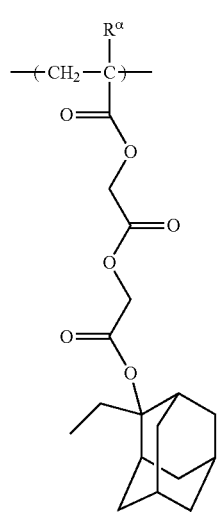
(a1-3-32)
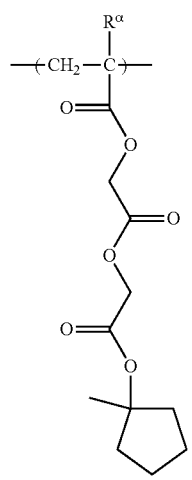
[Chemical Formula 15]
(a1-4-1)
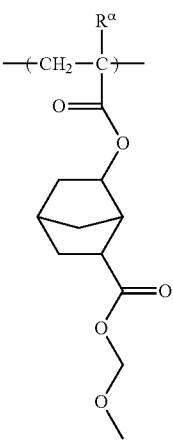
(a1-4-2)
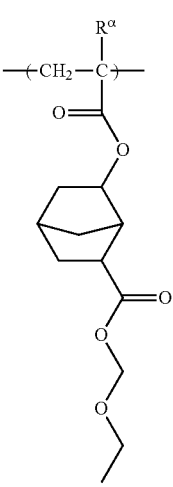
(a1-4-3)
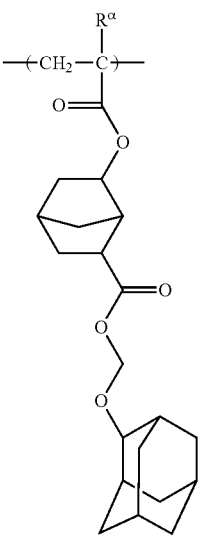

(a1-4-4)
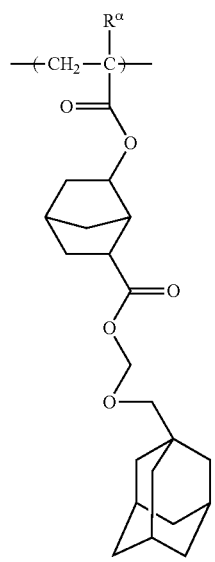
(a1-4-5)
(a1-4-6)
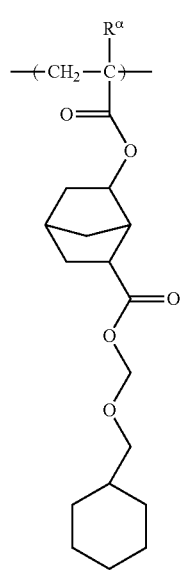
(a1-4-7)
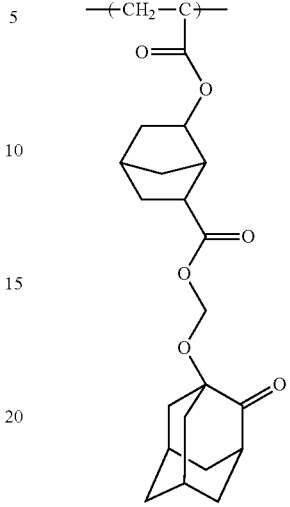
(a1-4-8)
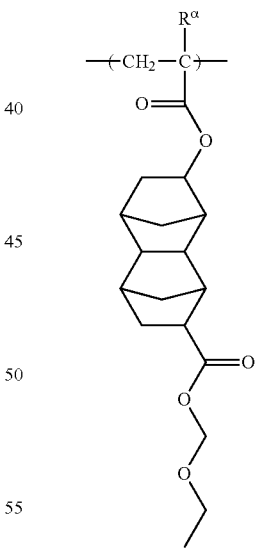

(a1-4-9)
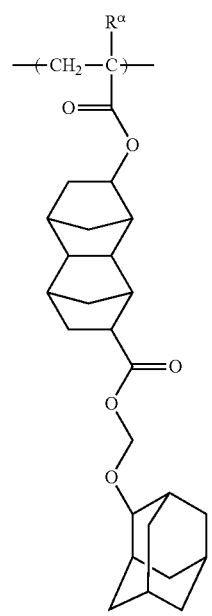
(a1-4-10)
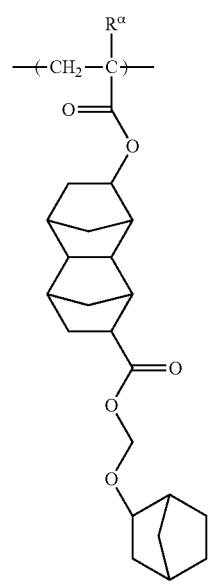
(a1-4-11)
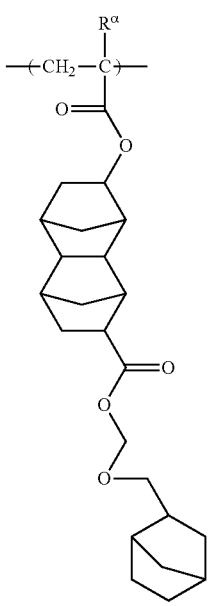
(a1-4-12)
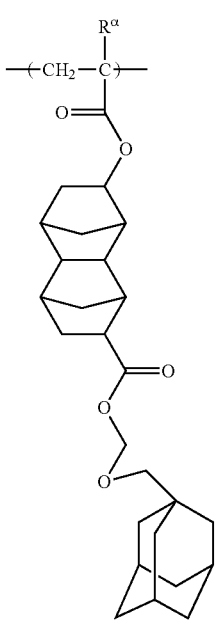

(a1-4-13)

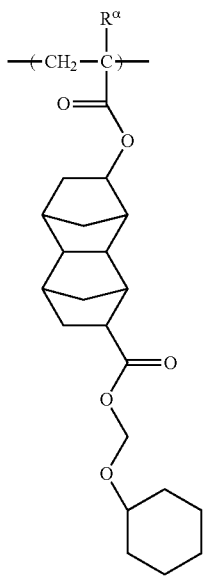

(a1-4-14)

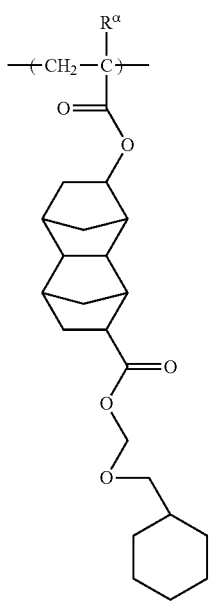

(a1-4-15)

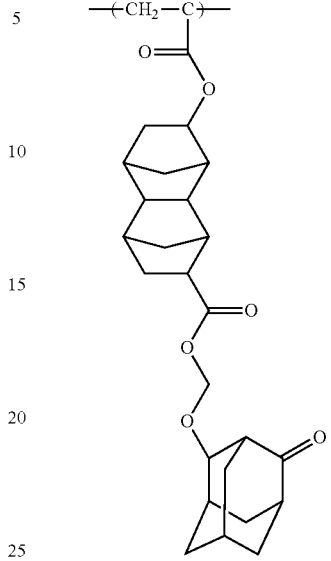

Among these, structural units represented by general formula (a1-1), (a1-2) or (a1-3) are preferable. More specifically, at least one structural unit selected from the group consisting of structural units represented by formulas (a1-1-1) to (a-1-1-4), (a1-1-20) to (a1-1-23), (a1-1-26), (a1-1-32) to (a1-1-34), (a1-2-1) to (a1-2-24) and (a1-3-25) to (a1-3-28) is more preferable.

Further, as the structural unit (a1), structural units represented by general formula (a1-1-01) shown below which includes the structural units represented by formulas (a1-1-1) to (a1-1-3) and (a1-1-26), structural units represented by general formula (a1-1-02) shown below which includes the structural units represented by formulas (a1-1-16), (a1-1-17) and (a1-1-20) to (a1-1-23), structural units represented by general formula (a1-3-01) shown below which include the structural units represented by formulas (a1-3-25) and (a1-3-26), and structural units represented by general formula (a1-3-02) shown below which include the structural units represented by formulas (a1-3-27) and (a1-3-28) are also particularly desirable.

[Chemical Formula 16]

(a1-1-01)

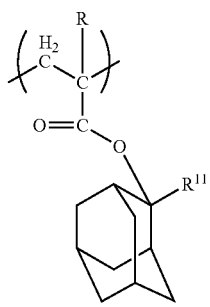

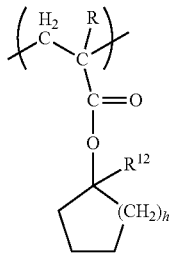

(a1-1-02)

In the formulas, each R independently represents a hydrogen atom, an alkyl group of 1 to 5 carbon atoms or a halogenated alkyl group of 1 to 5 carbon atoms; $R^{11}$ represents an alkyl group of 1 to 5 carbon atoms; $R^{12}$ represents an alkyl group of 1 to 7 carbon atoms; and h represents an integer of 1 to 6.

In general formula (a1-1-01), R is the same as defined above. The alkyl group of 1 to 5 carbon atoms for $R^{11}$ is the same as defined for the alkyl group of 1 to 5 carbon atoms for R, and a methyl group, an ethyl group or an isopropyl group is preferable.

In general formula (a1-1-02), R is the same as defined above. The alkyl group of 1 to 5 carbon atoms for $R^{12}$ is the same as defined for the alkyl group of 1 to 5 carbon atoms for R, and a methyl group, an ethyl group or an isopropyl group is preferable. h is preferably 1 or 2, and most preferably 2.

[Chemical Formula 17]

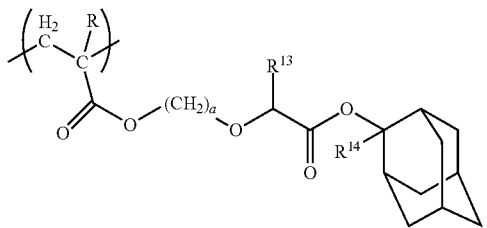

(a1-3-01)

In the formula, R represents a hydrogen atom, an alkyl group of 1 to 5 carbon atoms or a halogenated alkyl group of 1 to 5 carbon atoms; $R^{14}$ represents an alkyl group; $R^{13}$ represents a hydrogen atom or a methyl group; and a represents an integer of 1 to 10.

[Chemical Formula 18]

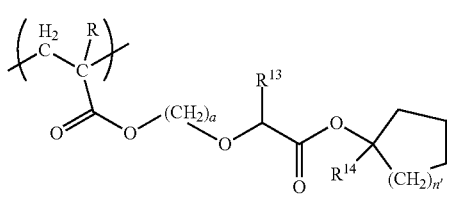

(a1-3-02)

In the formula, R represents a hydrogen atom, an alkyl group of 1 to 5 carbon atoms or a halogenated alkyl group of 1 to 5 carbon atoms; $R^{14}$ represents an alkyl group; $R^{13}$ represents a hydrogen atom or a methyl group; a represents an integer of 1 to 10; and n' represents an integer of 1 to 6.

In the above general formulas (a1-3-01) and (a1-3-02), R is the same as defined above.

$R^{13}$ is preferably a hydrogen atom.

$R^{14}$ is the same as defined for $R^{14}$ in the aforementioned formulas (1-1) to (1-9).

n' is preferably 1 or 2, and most preferably 2.

a is preferably an integer of 1 to 8, more preferably an integer of 2 to 5, and most preferably 2.

As the structural unit (a1), one type of structural unit may be used alone, or two or more types of structural units may be used in combination.

In the component (A1), the amount of the structural unit (a1) based on the combined total of all structural units constituting the component (A1) is preferably 5 to 80 mol %, more preferably 10 to 80 mol %, and still more preferably 15 to 75 mol %. When the amount of the structural unit (a1) is at least as large as the lower limit of the above-mentioned range, a pattern can be easily formed using a resist composition prepared from the component (A1), and various lithography properties such as sensitivity, resolution, LWR, EL and the like are also improved. On the other hand, when the amount of the structural unit (a1) is no more than the upper limit of the above-mentioned range, a good balance can be achieved with the other structural units.

(Structural Unit (a2))

The structural unit (a2) is a structural unit derived from an acrylate ester which may have the hydrogen atom bonded to the carbon atom on the α-position substituted with a substituent and contains a lactone-containing cyclic group.

The term "lactone-containing cyclic group" refers to a cyclic group including one ring containing a —O—C(=O)— structure (lactone ring). The term "lactone ring" refers to a single ring containing a —O—C(=O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate.

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 19]

(a2-1)
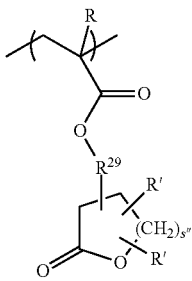

(a2-2)
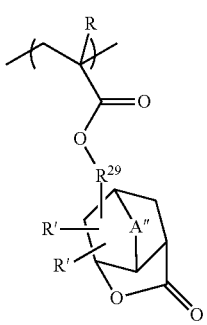

(a2-3)
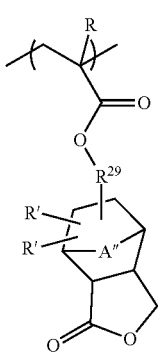

(a2-4)
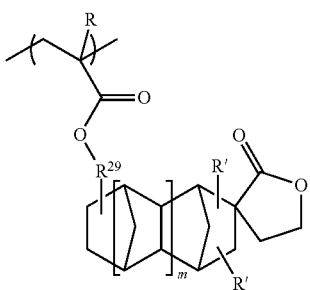

(a2-5)
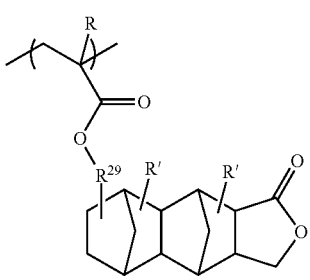

In the formulas, R represents a hydrogen atom, a lower alkyl group or a halogenated lower alkyl group; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined above for R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group.

In terms of industrial availability, R' is preferably a hydrogen atom.

R" preferably represents a hydrogen atom or a linear, branched or cyclic alkyl group of 1 to 15 carbon atoms.

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

A" is preferably an alkylene group of 1 to 5 carbon atoms or —O—, is more preferably an alkylene group of 1 to 5 carbon atoms, and is most preferably a methylene group.

$R^{29}$ represents a single bond or a divalent linking group. Examples of divalent linking groups include the same divalent linking groups as those described above for $Y^2$ in general formula (a1-0-2). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for the aliphatic hydrocarbon group represented by $Y^2$.

s" is preferably 1 or 2.

Specific examples of structural units represented by general formulas (a2-1) to (a2-5) are shown below.

In the formulas shown below, $R^\alpha$ represents a hydrogen atom, a methyl group or a trifluoromethyl group.

[Chemical Formula 20]

(a2-1-1)
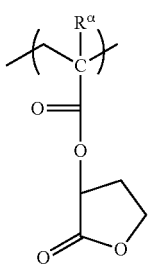

(a2-1-2) 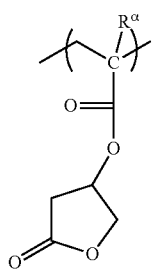
(a2-1-3) 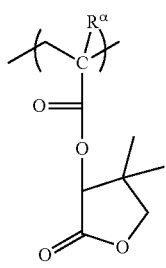
(a2-1-4) 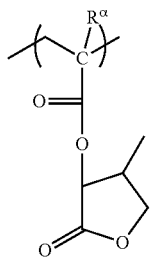
(a2-1-5) 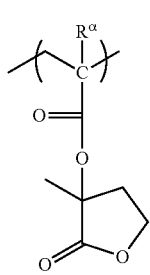
(a2-1-6) 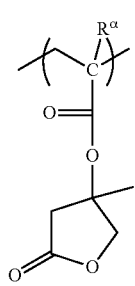
(a2-1-7) 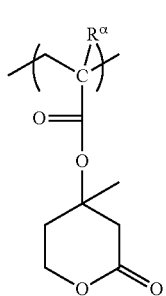
(a2-1-8) 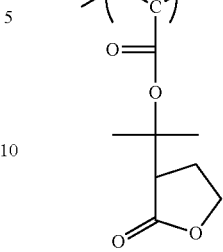
(a2-1-9) 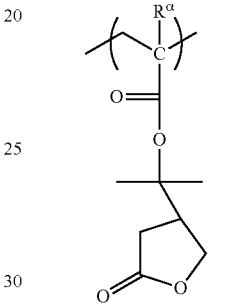
(a2-1-10) 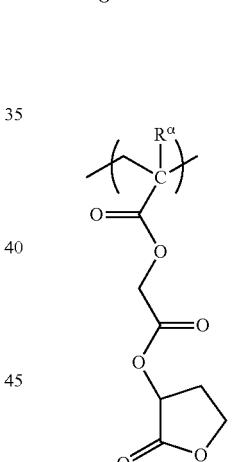
(a2-1-11) 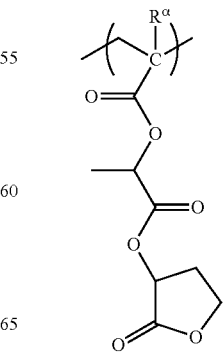

(a2-1-12)
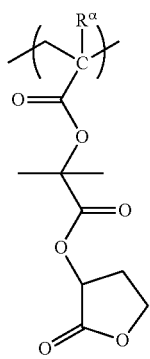
(a2-1-13)
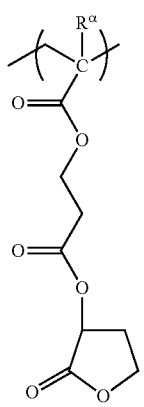
[Chemical Formula 21]
(a2-2-1)
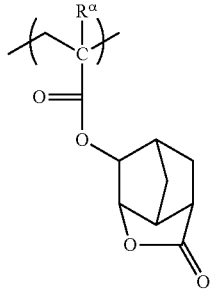
(a2-2-2)
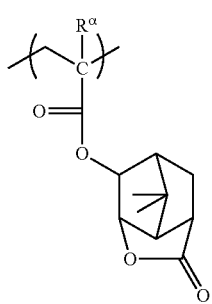
(a2-2-3)
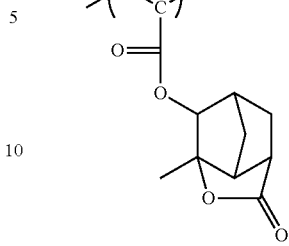
(a2-2-4)
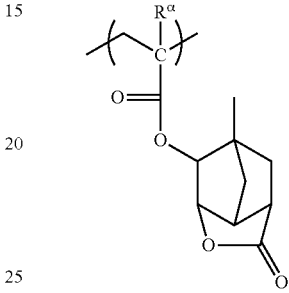
(a2-2-5)
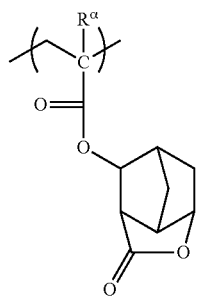
(a2-2-6)
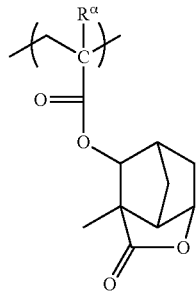
(a2-2-7)
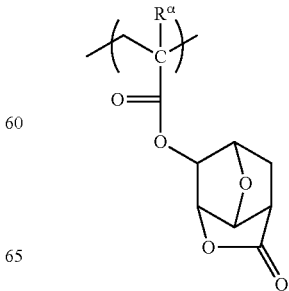

(a2-2-8)
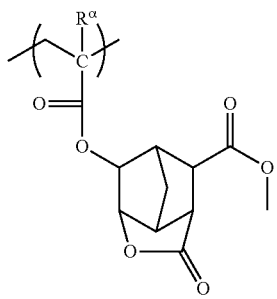
(a2-2-9)
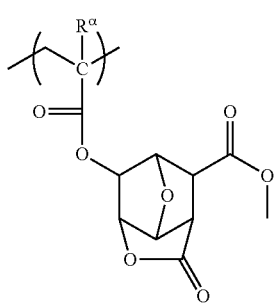
(a2-2-10)
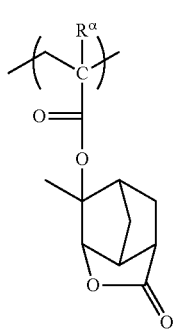
(a2-2-11)
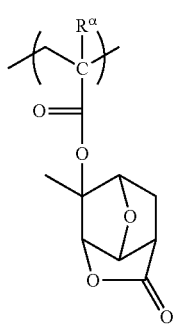
(a2-2-12)
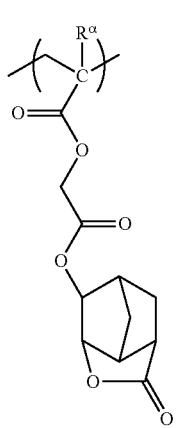
(a2-2-13)
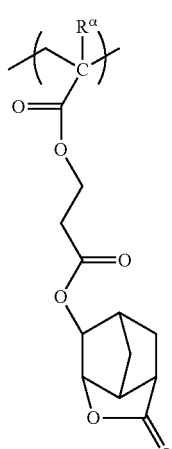
(a2-2-14)
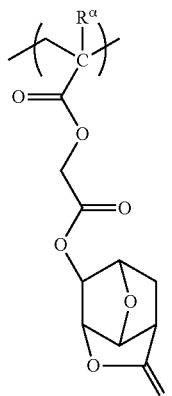
(a2-2-15)
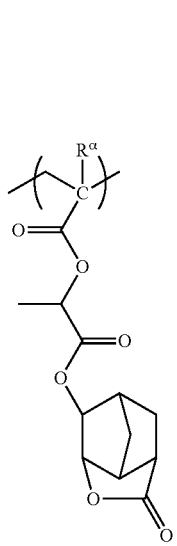

(a2-2-16)
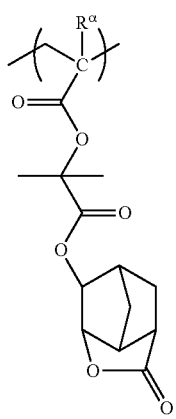
(a2-2-17)
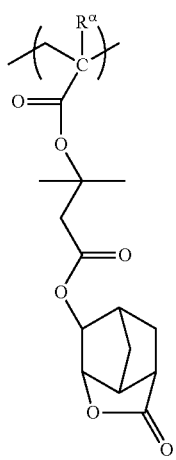
[Chemical Formula 22]
(a2-3-1)
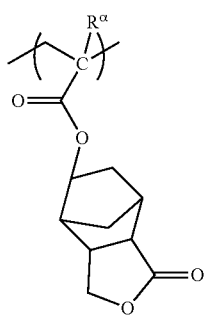
(a2-3-2)
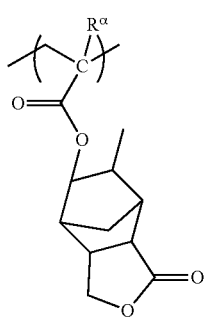
(a2-3-3)
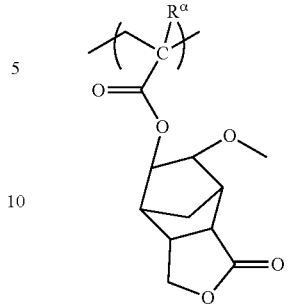
(a2-3-4)
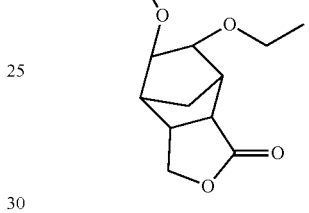
(a2-3-5)
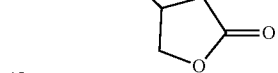
[Chemical Formula 23]
(a2-4-1)
(a2-4-2)
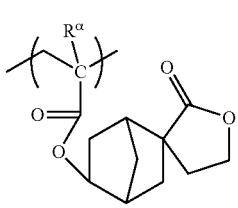

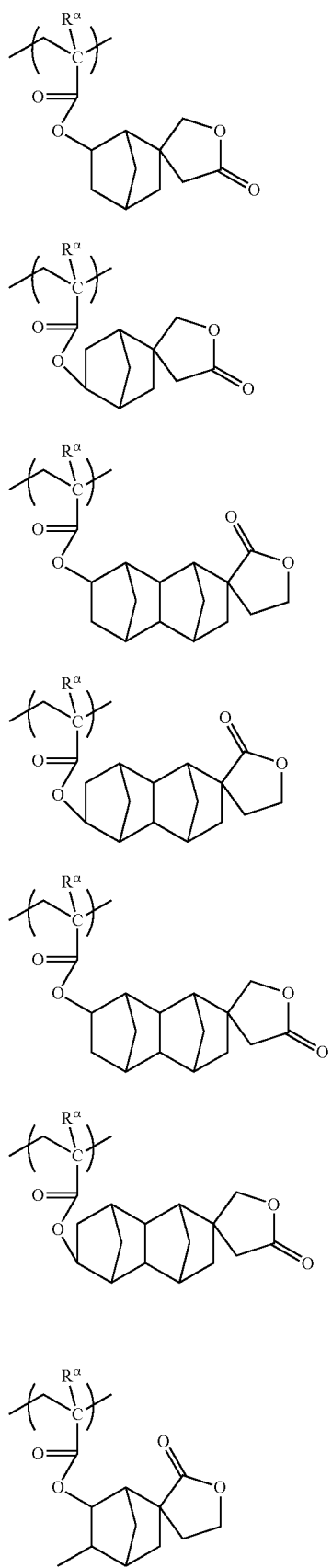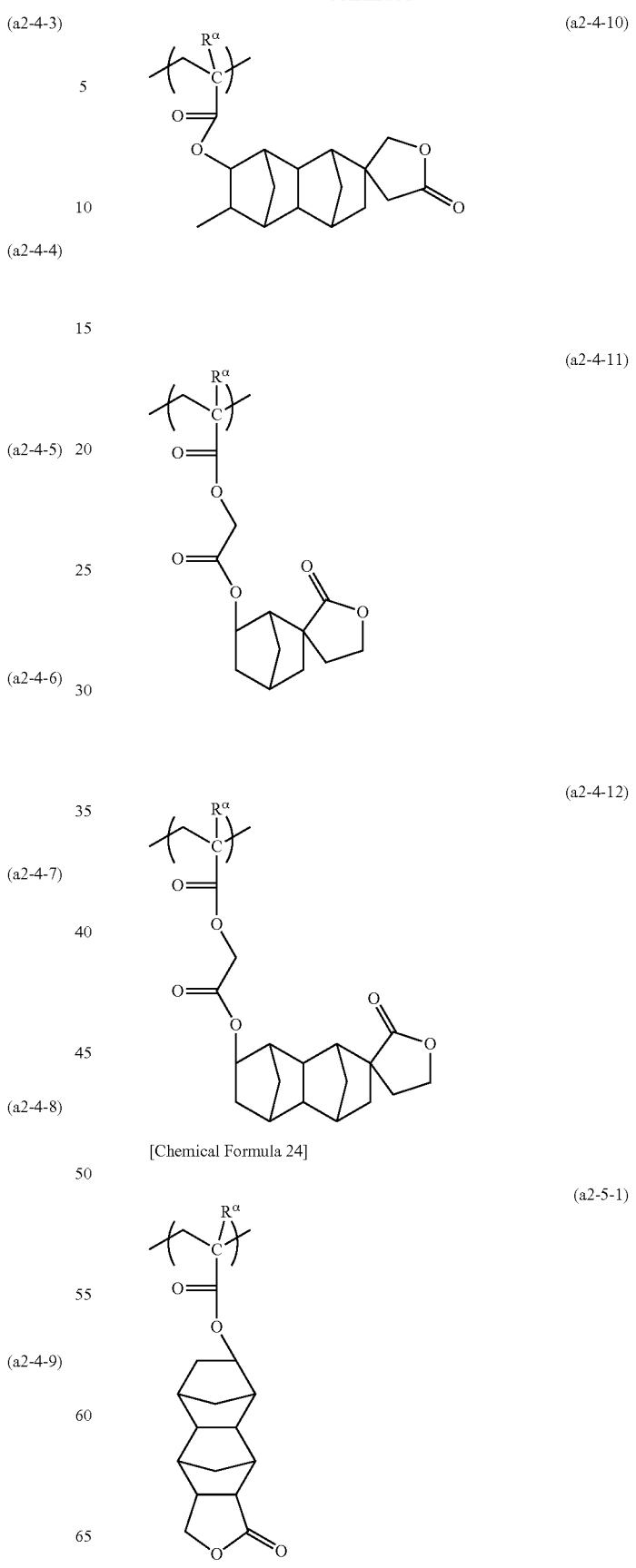

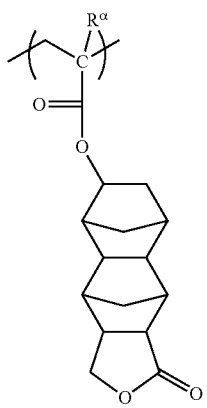
(a2-5-2)

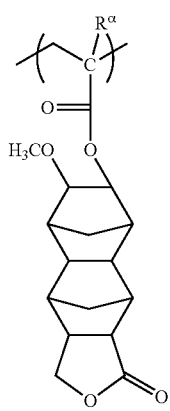
(a2-5-3)

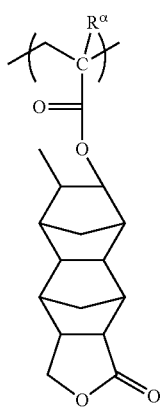
(a2-5-4)

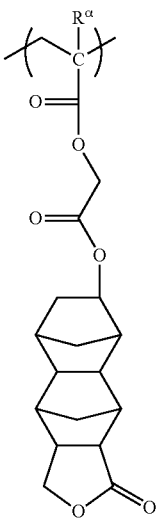
(a2-5-5)

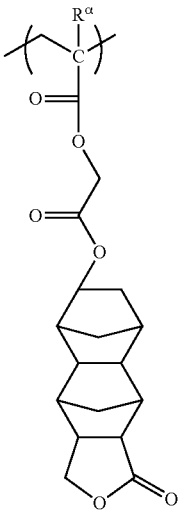
(a2-5-6)

As the structural unit (a2) contained in the component (A1), one type of structural unit may be used, or two or more types may be used.

As the structural unit (a2), at least one structural unit selected from the group consisting of structural units represented by formulas (a2-1) to (a2-5) is preferable, and at least one structural unit selected from the group consisting of structural units represented by formulas (a2-1) to (a2-3) is more preferable. Of these, it is preferable to use at least one structural unit selected from the group consisting of structural units represented by formulas (a2-1-1), (a2-1-2), (a2-2-1), (a2-2-7), (a2-2-12), (a2-2-14), (a2-3-1) and (a2-3-5).

In the component (A1), the amount of the structural unit (a2) based on the combined total of all structural units constituting the component (A1) is preferably 5 to 60 mol %, more preferably 10 to 50 mol %, and still more preferably 10 to 45 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

[Structural Unit (a0)]

The structural unit (a0) is a structural unit derived from an acrylate ester which may have the hydrogen atom bonded to the carbon atom on the α-position substituted with a substituent and contains a —$SO_2$— containing cyclic group.

By virtue of the structural unit (a0) containing a —$SO_2$— containing cyclic group, a resist composition containing the component (A1) including the structural unit (a0) is capable of improving the adhesion of a resist film to a substrate. Further, the structural unit (a0) contributes to improvement in various lithography properties such as sensitivity, resolution, exposure latitude (EL margin), line width roughness (LWR), line edge roughness (LER) and mask reproducibility.

Here, an "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group.

In the —$SO_2$— containing cyclic group, the ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings.

The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

The —$SO_2$— containing cyclic group preferably has 3 to 30 carbon atoms, more preferably 4 to 20 carbon atoms, still more preferably 4 to 15 carbon atoms, and most preferably 4 to 12 carbon atoms. Herein, the number of carbon atoms refers to the number of carbon atoms constituting the ring skeleton, excluding the number of carbon atoms within a substituent.

The —$SO_2$— containing cyclic group may be either a —$SO_2$— containing aliphatic cyclic group or a —$SO_2$— containing aromatic cyclic group. A —$SO_2$— containing aliphatic cyclic group is preferable.

Examples of the —$SO_2$— containing aliphatic cyclic group include aliphatic cyclic groups in which part of the carbon atoms constituting the ring skeleton thereof has been substituted with a —$SO_2$— group or a —O—$SO_2$— group and has at least one hydrogen atom removed from the aliphatic hydrocarbon ring. Specific examples include an aliphatic hydrocarbon ring in which a —$CH_2$— group constituting the ring skeleton thereof has been substituted with a —$SO_2$— group and has at least one hydrogen atom removed therefrom; and an aliphatic hydrocarbon ring in which a —$CH_2$—$CH_2$— group constituting the ring skeleton thereof has been substituted with a —O—$SO_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic alicyclic hydrocarbon group, a group in which two hydrogen atoms have been removed from a monocycloalkane of 3 to 6 carbon atoms is preferable. Examples of the monocycloalkane include cyclopentane and cyclohexane. As the polycyclic alicyclic hydrocarbon group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —$SO_2$— containing cyclic group may have a substituent. Examples of the substituent include an alkyl group, an alkoxy group, a halogen atom, a halogenated alkyl group, a hydroxyl group, an oxygen atom (=O), —COOR", —OC(=O)R", a hydroxyalkyl group and a cyano group (wherein R" represents a hydrogen atom or an alkyl group).

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkoxy group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —O C(=O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxyl group.

More specific examples of the —$SO_2$— containing cyclic group include groups represented by general formulas (3-1) to (3-4) shown below.

[Chemical Formula 25]

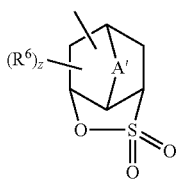 (3-1)

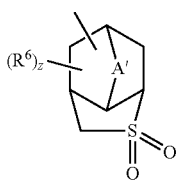 (3-2)

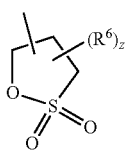 (3-3)

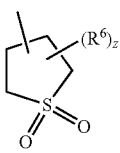 (3-4)

In the formulas, A' represents an oxygen atom, a sulfur atom or an alkylene group of 1 to 5 carbon atoms which may contain an oxygen atom or a sulfur atom; z represents an integer of 0 to 2; and $R^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, —CH$_2$—S—CH$_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

When z is 2, the plurality of $R^6$ may be the same or different from each other.

As the alkyl group, alkoxy group, halogenated alkyl group, —COOR", —OC(=O)R" and hydroxyalkyl group for $R^6$, the same alkyl groups, alkoxy groups, halogenated alkyl groups, —COOR", —OC(=O)R" and hydroxyalkyl groups as those described above as the substituent for the —SO$_2$— containing cyclic group can be mentioned.

Specific examples of the cyclic groups represented by general formulas (3-1) to (3-4) are shown below. In the formulas shown below, "Ac" represents an acetyl group.

[Chemical Formula 26]

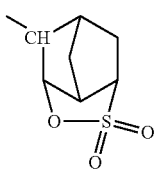 (3-1-1)

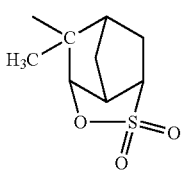 (3-1-2)

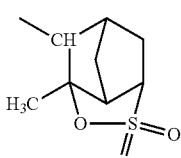 (3-1-3)

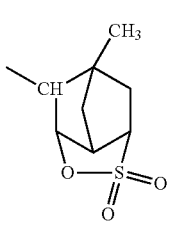 (3-1-4)

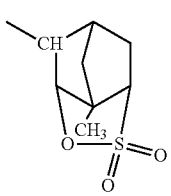 (3-1-5)

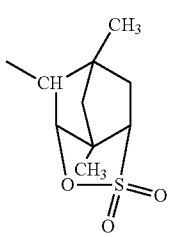 (3-1-6)

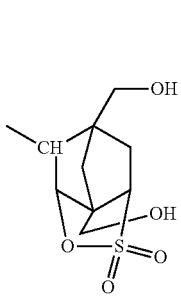 (3-1-7)

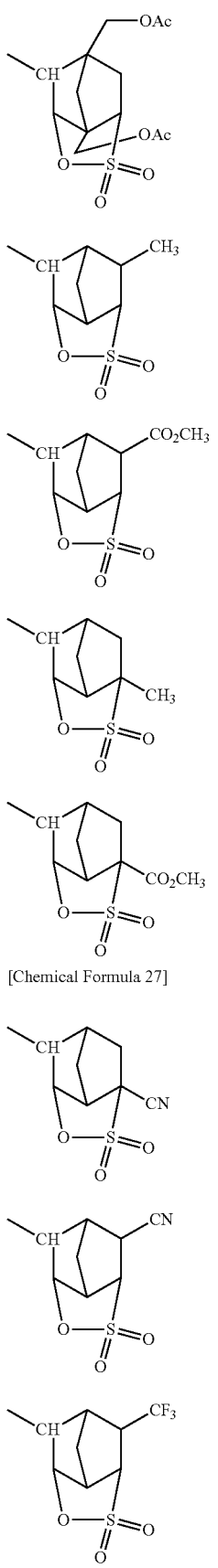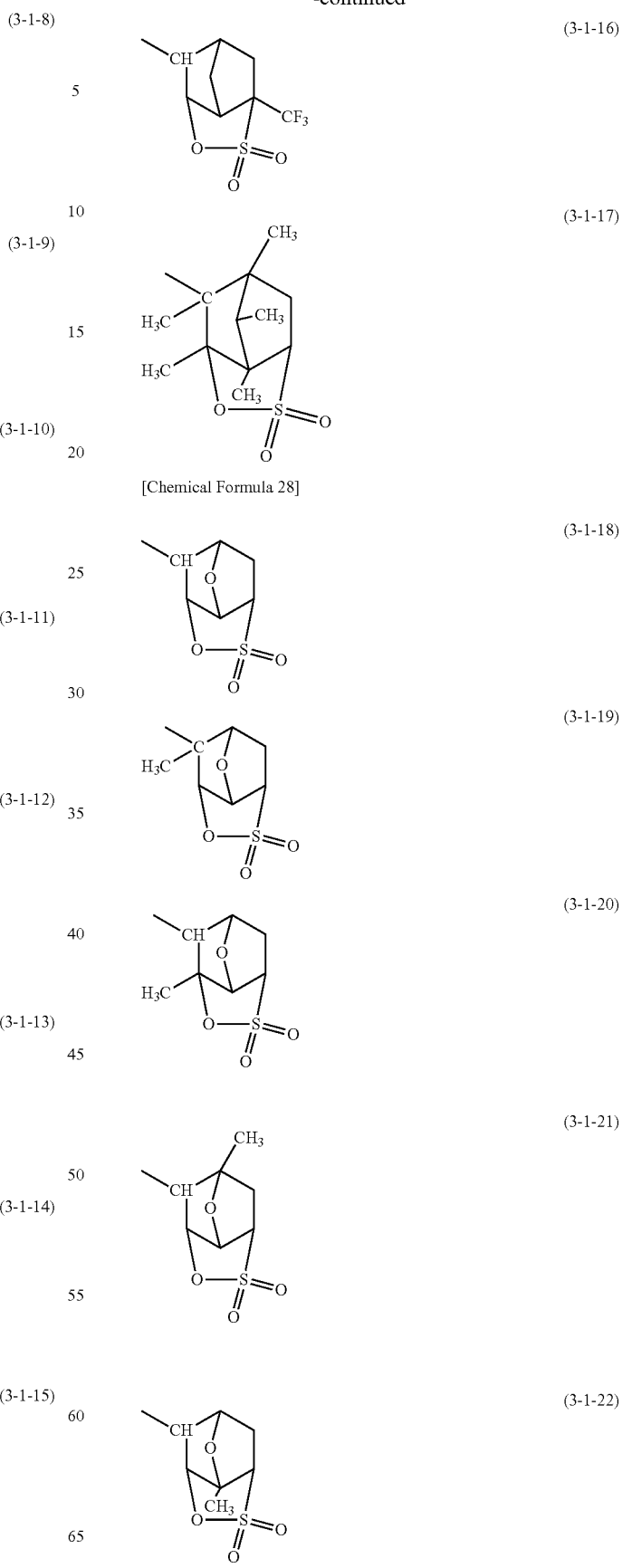

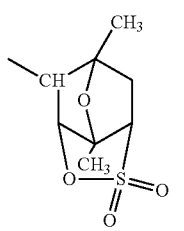 (3-1-23)
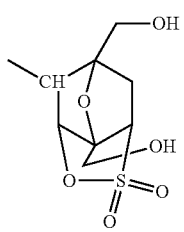 (3-1-24)
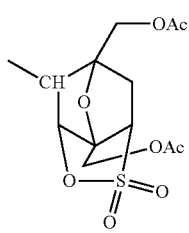 (3-1-25)
[Chemical Formula 29]
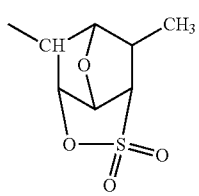 (3-1-26)
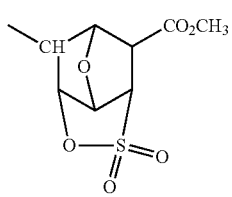 (3-1-27)
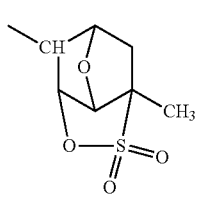 (3-1-28)
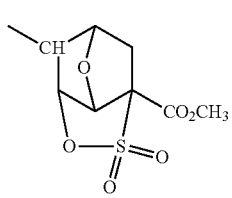 (3-1-29)
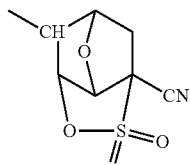 (3-1-30)
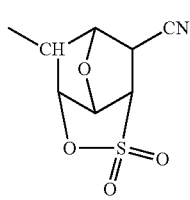 (3-1-31)
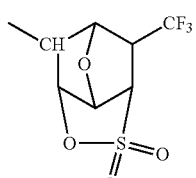 (3-1-32)
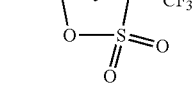 (3-1-33)
[Chemical Formula 30]
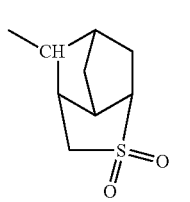 (3-2-1)
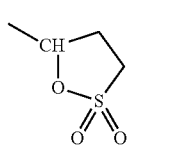 (3-2-2)
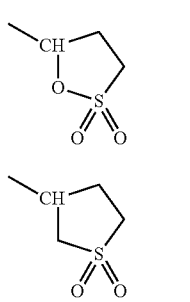 (3-3-1)
(3-4-1)
Of the various possibilities described above, as the —SO$_2$— containing cyclic group, a group represented by the aforementioned general formula (3-1), (3-3) or (3-4) is preferable, at least one member selected from the group consisting of groups represented by the aforementioned chemical formulas (3-1-1), (3-1-18), (3-3-1) and (3-4-1) is more preferable, and a group represented by chemical formula (3-1-1) is most preferable.

More specifically, examples of the structural unit (a0) include structural units represented by general formula (a0-0) shown below.

[Chemical Formula 31]

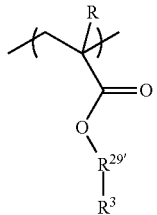

(a0-0)

In the formula, R represents a hydrogen atom, an alkyl group of 1 to 5 carbon atoms or a halogenated alkyl group of 1 to 5 carbon atoms; $R^3$ represents a —$SO_2$— containing cyclic group; and $R^{29'}$ represents a single bond or a divalent linking group.

In general formula (a0-0), R represents a hydrogen atom, an alkyl group of 1 to 5 carbon atoms or a halogenated alkyl group of 1 to 5 carbon atoms.

As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group for R is a group in which part or all of the hydrogen atoms of the aforementioned alkyl group of 1 to 5 carbon atoms has been substituted with halogen atoms. Examples of the halogen atom include a fluorine atom, a chlorine atom, a bromine atom and an iodine atom, and a fluorine atom is particularly desirable.

R is preferably a hydrogen atom, an alkyl group of 1 to 5 carbon atoms or a fluorinated alkyl group of 1 to 5 carbon atoms. In terms of industrial availability, a hydrogen atom or a methyl group is the most desirable.

In formula (a0-0), $R^3$ is the same as defined for the aforementioned —$SO_2$— containing group.

$R^{29'}$ may be either a single bond or a divalent linking group. In terms of the effects of the present invention, a divalent linking group is preferable.

As the divalent linking group for $R^{29'}$, the same groups as those described as the divalent linking group represented by $Y^2$ in general formula (a1-0-2) explained above in relation to the structural unit (a1) can be used.

As the divalent linking group for $R^{29'}$, an alkylene group, a divalent alicyclic hydrocarbon group or a divalent linking group containing a hetero atom is preferable. Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above for the aliphatic hydrocarbon group represented by $Y^2$.

As the divalent linking group containing an ester bond, a group represented by general formula: —$R^2$—C(=O)—O— (in the formula, $R^2$ represents a divalent linking group) is particularly desirable. Namely, the structural unit (a0) is preferably a structural unit represented by general formula (a0-0-1) shown below.

[Chemical Formula 32]

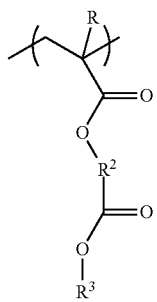

(a0-0-1)

In the formula, R represents a hydrogen atom, an alkyl group of 1 to 5 carbon atoms or a halogenated alkyl group of 1 to 5 carbon atoms; $R^2$ represents a divalent linking group; and $R^3$ represents an —$SO_2$— containing cyclic group.

$R^2$ is not particularly limited. For example, the same divalent linking groups as those described above for $R^{29'}$ in general formula (a0-0) can be mentioned.

As the divalent linking group for $R^2$, a linear or branched alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene group, divalent alicyclic hydrocarbon group and divalent linking group containing a hetero atom as those described above as preferable examples of $R^{29'}$ can be mentioned.

Among these, a linear or branched alkylene group, or a divalent linking group containing an oxygen atom as a hetero atom is more preferable.

As the linear alkylene group, a methylene group or an ethylene group is preferable, and a methylene group is particularly desirable.

As the branched alkylene group, an alkylmethylene group or an alkylethylene group is preferable, and —CH($CH_3$)—, —C($CH_3$)$_2$— or —C($CH_3$)$_2$$CH_2$— is particularly desirable.

As the divalent linking group containing an oxygen atom, a divalent linking group containing an ether bond or an ester bond is preferable, and a group represented by the aforementioned formula —$Y^{21}$—O—$Y^{22}$—, —[$Y^{21}$—C(=O)—O]$_m$—$Y^{22}$— or —$Y^{21}$—O—C(=O)—$Y^{22}$— is more preferable. $Y^{21}$, $Y^{22}$ and m' are the same as defined above.

Among these, a group represented by the formula —$Y^{21}$—O—C(=O)—$Y^{22}$— is preferable, and a group represented by the formula —($CH_2$)$_c$—O—C(=O)—($CH_2$)$_d$— is particularly desirable. c represents an integer of 1 to 5, preferably an integer of 1 to 3, and more preferably 1 or 2. d represents an integer of 1 to 5, preferably an integer of 1 to 3, and more preferably 1 or 2.

In particular, as the structural unit (a0), a structural unit represented by general formula (a0-0-11) or (a0-0-12) shown below is preferable, and a structural unit represented by general formula (a0-0-12) is more preferable.

[Chemical Formula 33]

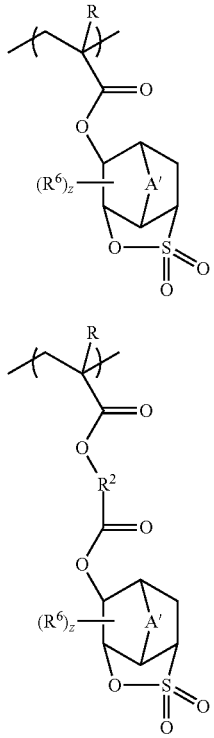

(a0-0-11)

(a0-0-12)

In the formulas, R, A', $R^6$, z and $R^2$ are the same as defined above.

In general formula (a0-0-11), A' is preferably a methylene group, an ethylene group, an oxygen atom (—O—) or a sulfur atom (—S—).

As $R^2$, a linear or branched alkylene group or a divalent linking group containing an oxygen atom is preferable. As the linear or branched alkylene group and the divalent linking group containing an oxygen atom represented by $R^2$, the same linear or branched alkylene groups and the divalent linking groups containing an oxygen atom as those described above can be mentioned.

As the structural unit represented by general formula (a0-0-12), a structural unit represented by general formula (a0-0-12a) or (a0-0-12b) shown below is particularly desirable.

[Chemical Formula 34]

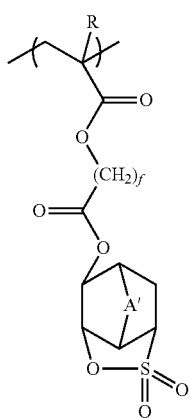

(a0-0-12a)

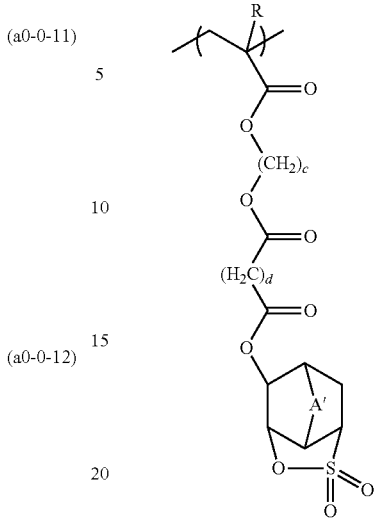

(a0-0-12b)

In the formulas, R and A' are the same as defined above; and each of c, d and f independently represents an integer of 1 to 3.

As the structural unit (a0) contained in the component (A1), one type of structural unit may be used, or two or more types may be used.

In terms of achieving an excellent shape for a resist pattern formed using a resist composition containing the component (A1) and excellent lithography properties such as EL margin, LWR and mask reproducibility, the amount of the structural unit (a0) within the component (A1), based on the combined total of all structural units constituting the component (A1) is preferably 1 to 60 mol %, more preferably 5 to 55 mol %, still more preferably 10 to 50 mol %, and most preferably 15 to 50 mol %.

(Structural Unit (a3))

The structural unit (a3) is a structural unit derived from an acrylate ester which may have the hydrogen atom bonded to the carbon atom on the α-position substituted with a substituent and contains a polar group-containing aliphatic hydrocarbon group (excluding those that correspond to the aforementioned structural units (a1), (a2) and (a0).

By virtue of the component (A1) containing the structural unit (a3), the hydrophilicity of the component (A) in the exposed portions is improved, which relatively increases the solubility in a developing solution containing a polar organic solvent (organic developing solution) to contribute to favorable improvements in the resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups may be either a polycyclic group or a monocyclic group, and can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 35]

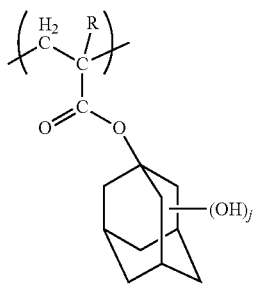
(a3-1)

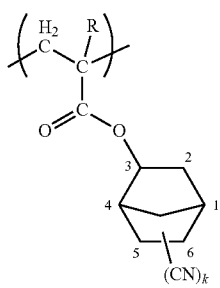
(a3-2)

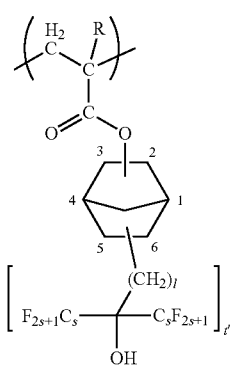
(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), one type of structural unit may be used, or two or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Other Structural Units)

The component (A1) may also include a structural unit other than the aforementioned structural units, as long as the effects of the present invention are not impaired.

As such a structural unit, any other structural unit which cannot be classified as the aforementioned structural units can be used without any particular limitation, and any of the multitude of conventional structural units used within resist resins for ArF excimer lasers or KrF excimer lasers (and particularly for ArF excimer lasers) can be used.

Examples of other structural units include a structural unit (a4) derived from an acrylate ester which may have the hydrogen atom bonded to the carbon atom on the α-position substituted with a substituent and contains a non-acid-dissociable aliphatic polycyclic group.

In the structural unit (a4), examples of this polycyclic group include the same polycyclic groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a-4-1) to (a-4-5) shown below.

[Chemical Formula 36]

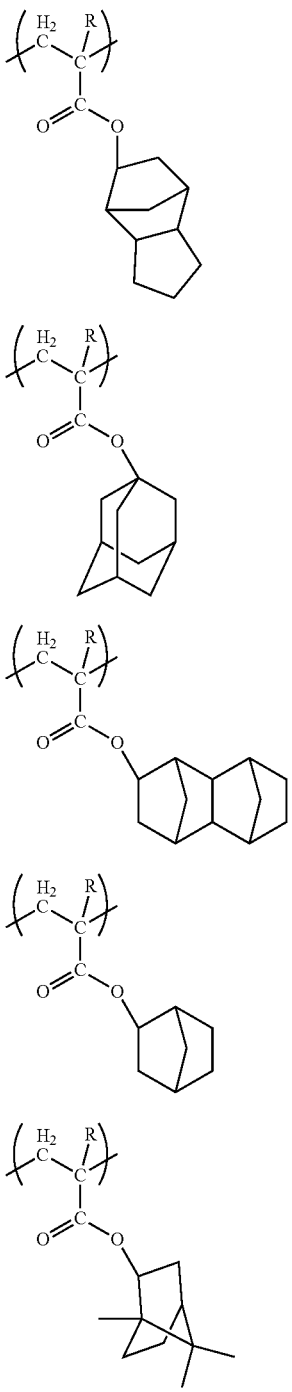

(a4-1)
(a4-2)
(a4-3)
(a4-4)
(a4-5)

In the formulas, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

In the present invention, the component (A) included in the resist composition contains the resin component (A1) containing the structural unit (a1).

Preferred examples of the component (A1) include a polymeric compound containing the structural unit (a1) and at least one structural unit selected from the group consisting of the structural unit (a2) and the structural unit (a0); a polymeric compound containing the structural unit (a1) and the structural unit (a3); and a polymeric compound containing the structural unit (a1), at least one structural unit selected from the group consisting of the structural unit (a2) and the structural unit (a0), and the structural unit (a3).

More specifically, as such polymeric compounds, a polymeric compound composed of the structural units (a1), (a2) and (a3); a polymeric compound composed of the structural unit (a1), (a3) and (a0); a polymeric compound composed of the structural unit (a1), (a2), (a3) and (a0); and a polymeric compound composed of the structural units (a1) and (a2) can be used.

In the component (A), as the component (A1), one type may be used alone, or two or more types may be used in combination.

The weight average molecular weight (Mw) (the polystyrene equivalent value determined by gel permeation chromatography (GPC)) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is not particularly limited, but is preferably 1.0 to 5.0, more preferably 1.0 to 3.0, and most preferably 1.0 to 2.5. Here, Mn is the number average molecular weight.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH during the above polymerization, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

In the present invention, as the component (A), the resin composition may also contain a base component which exhibits increased solubility in an organic solvent under the action of acid other than the component (A1).

Such base component other than the component (A1) is not particularly limited, and any of the multitude of conventional base components used within chemically amplified resist compositions (e.g., base resins such as novolak resins and polyhydroxystyrene-based resins (PHS), or low molecular weight compound components) can be appropriately selected for use.

Examples of the low molecular weight compound components include low molecular weight compounds that have a molecular weight of at least 500 and less than 4,000 and contains an acid dis sociable group and hydrophilic group described above in connection with the component (A1). Specific examples of the low molecular weight compound include compounds containing a plurality of phenol skeletons in which a part of the hydrogen atoms within hydroxyl groups have been substituted with the aforementioned acid dissociable groups.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, a resist pattern exhibiting a high resolution and having an excellent shape with a high rectangularity can be formed.

In the resist composition, the amount of the component (A) can be appropriately adjusted depending on the thickness of the resist film to be formed, and the like.

<Component (B)>

In the present invention, as the acid generator component (B) contained in a resist composition, there is no particular limitation, and any of the known acid generators used in conventional chemically amplified resist compositions can be used.

Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, a compound represented by general formula (b-1) or (b-2) shown below can be used.

[Chemical Formula 37]

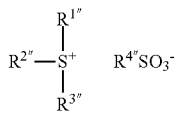
(b-1)

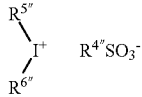
(b-2)

In the formulas, each of $R^{1''}$ to $R^{3''}$ and $R^{5''}$ to $R^{6''}$ independently represents an aryl group which may have a substituent, an alkyl group or an alkenyl group, wherein two of $R^{1''}$ to $R^{3''}$ in formula (b-1) may be bonded to each other to form a ring with the sulfur atom in the formula; and $R^{4''}$ represents an alkyl group which may have a substituent, a halogenated alkyl group, an aryl group or an alkenyl group.

In formula (b-1), each of $R^{1''}$ to $R^{3''}$ independently represents an aryl group which may have a substituent, an alkyl group or an alkenyl group. Two of $R^{1''}$ to $R^{3''}$ may be mutually bonded to form a ring with the sulfur atom in the formula.

Further, at least one of $R^{1''}$ to $R^{3''}$ preferably represents an aryl group, more preferably two or more of $R^{1''}$ to $R^{3''}$ represent aryl groups, and it is particularly desirable that all of $R^{1''}$ to $R^{3''}$ be aryl groups, as such groups yield superior improvements in the lithography properties and resist pattern shape.

Examples of the aryl groups for $R^{1''}$ to $R^{3''}$ include an unsubstituted aryl group having 6 to 20 carbon atoms; and a substituted aryl group in which a part or all of the hydrogen atoms of the aforementioned unsubstituted aryl group has been substituted with alkyl groups, alkoxy groups, halogen atoms, hydroxyl groups, oxo groups (=O), aryl groups, alkoxyalkyloxy groups, alkoxycarbonylalkyloxy groups, —C(=O)—O—$R^{6'}$, —O—C(=O)—$R^{7'}$, —O—$R^{8'}$ or the like. Each of $R^{6'}$, $R^{7'}$ and $R^{8'}$ represents a linear or branched saturated hydrocarbon group of 1 to 25 carbon atoms, a cyclic saturated hydrocarbon group of 3 to 20 carbon atoms, or a linear or branched, aliphatic unsaturated hydrocarbon group of 2 to 5 carbon atoms.

The unsubstituted aryl group for $R^{1''}$ to $R^{3''}$ is preferably an aryl group having 6 to 10 carbon atoms because it can be synthesized at a low cost. Specific examples thereof include a phenyl group and a naphthyl group.

The alkyl group as the substituent for the substituted aryl group represented by $R^{1''}$ to $R^{3''}$ is preferably an alkyl group having 1 to 5 carbon atoms, and a methyl group, an ethyl group, a propyl group, an n-butyl group, or a tert-butyl group is particularly desirable.

The alkoxy group as the substituent for the substituted aryl group is preferably an alkoxy group having 1 to 5 carbon atoms, and a methoxy group, an ethoxy group, an n-propoxy group, an iso-propoxy group, an n-butoxy group or a tert-butoxy group is particularly desirable.

The halogen atom as the substituent for the substituted aryl group is preferably a fluorine atom.

As the aryl group as the substituent for the substituted aryl group, the same aryl groups as those described above for $R^{1''}$ to $R^{3''}$ can be mentioned, and an aryl group of 6 to 20 carbon atoms is preferable, an aryl group of 6 to 10 carbon atoms is more preferable, and a phenyl group or a naphthyl group is still more preferable.

Examples of alkoxyalkyloxy groups as the substituent for the substituted aryl group include groups represented by a general formula shown below:

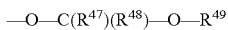

—O—C($R^{47}$)($R^{48}$)—O—$R^{49}$

In the formula, $R^{47}$ and $R^{48}$ each independently represents a hydrogen atom or a linear or branched alkyl group; and $R^{49}$ represents an alkyl group.

The alkyl group for $R^{47}$ and $R^{48}$ preferably has 1 to 5 carbon atoms, and may be either linear or branched. As the alkyl group, an ethyl group or a methyl group is preferable, and a methyl group is most preferable.

It is preferable that at least one of $R^{47}$ and $R^{48}$ be a hydrogen atom. It is particularly desirable that at least one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Examples of the alkoxycarbonylalkyloxy group as the substituent for the substituted aryl group include groups represented by a general formula shown below:

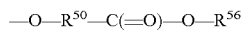
—O—R$^{50}$—C(=O)—O—R$^{56}$

In the formula, R$^{50}$ represents a linear or branched alkylene group, and R$^{56}$ represents a tertiary alkyl group.

The linear or branched alkylene group for R$^{50}$ preferably has 1 to 5 carbon atoms, and examples thereof include a methylene group, an ethylene group, a trimethylene group, a tetramethylene group and a 1,1-dimethylethylene group.

Examples of the tertiary alkyl group for R$^{56}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

Further, a group in which R$^{56}$ in the group represented by the aforementioned general formula: —O—R$^{50}$—C(=O)—O—R$^{56}$ has been substituted with R$^{56'}$ can also be mentioned. R$^{56'}$ represents a hydrogen atom, an alkyl group, a fluorinated alkyl group or an aliphatic cyclic group which may contain a hetero atom.

The alkyl group for R$^{56'}$ is the same as defined for the alkyl group for the aforementioned R$^{49}$.

Examples of the fluorinated alkyl group for R$^{56'}$ include groups in which part or all of the hydrogen atoms within the alkyl group for R$^{49}$ has been substituted with a fluorine atom.

Examples of the aliphatic cyclic group for R$^{56'}$ which may contain a hetero atom include an aliphatic cyclic group which does not contain a hetero atom, an aliphatic cyclic group containing a hetero atom in the ring structure, and an aliphatic cyclic group in which a hydrogen atom has been substituted with a hetero atom.

As an aliphatic cyclic group for R$^{56'}$ which does not contain a hetero atom, a group in which one or more hydrogen atoms have been removed from a monocycloalkane or a polycycloalkane such as a bicycloalkane, a tricycloalkane or a tetracycloalkane can be mentioned. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Specific examples of the aliphatic cyclic group for R$^{56'}$ containing a hetero atom in the ring structure include groups represented by formulas (L1) to (L6) and (S1) to (S4) described later.

As the aliphatic cyclic group for R$^{56'}$ in which a hydrogen atom has been substituted with a hetero atom, an aliphatic cyclic group in which a hydrogen atom has been substituted with an oxygen atom (=O) can be mentioned.

Each of R$^{6'}$, R$^{7'}$ and R$^{8'}$ in —C(=O)—O—R$^{6'}$, —O—C(=O)—R$^{7'}$, —O—R$^{8'}$ represents a linear or branched saturated hydrocarbon group of 1 to 25 carbon atoms, a cyclic saturated hydrocarbon group of 3 to 20 carbon atoms, or a linear or branched, aliphatic unsaturated hydrocarbon group of 2 to 5 carbon atoms.

The linear or branched, saturated hydrocarbon group has 1 to 25 carbon atoms, preferably 1 to 15 carbon atoms, and more preferably 4 to 10 carbon atoms.

Examples of the linear, saturated hydrocarbon group include a methyl group, an ethyl group, a propyl group, a butyl group, a pentyl group, a hexyl group, a heptyl group, an octyl group, a nonyl group and a decyl group.

Examples of the branched, saturated hydrocarbon group include the tertiary alkyl groups described above for R$^{56}$, a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The linear or branched, saturated hydrocarbon group may have a substituent. Examples of the substituent include an alkoxy group, a halogen atom, a halogenated alkyl group, a hydroxyl group, an oxygen atom (=O), a cyano group and a carboxy group.

The alkoxy group as the substituent for the linear or branched saturated hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the linear or branched, saturated alkyl group include a fluorine atom, a chlorine atom, a bromine atom and an iodine atom, and a fluorine atom is preferable.

Examples of the halogenated alkyl group as the substituent for the linear or branched, saturated hydrocarbon group include a group in which part or all of the hydrogen atoms within the aforementioned linear or branched, saturated hydrocarbon group have been substituted with the aforementioned halogen atoms.

The cyclic saturated hydrocarbon group of 3 to 20 carbon atoms for R$^{6'}$, R$^{7'}$ and R$^{8'}$ may be either a polycyclic group or a monocyclic group, and examples thereof include groups in which one hydrogen atom has been removed from a monocycloalkane, and groups in which one hydrogen atom has been removed from a polycycloalkane (e.g., a bicycloalkane, a tricycloalkane or a tetracycloalkane). More specific examples include groups in which one hydrogen atom has been removed from a monocycloalkane such as cyclopentane, cyclohexane, cycloheptane or cyclooctane; and groups in which one or more hydrogen atoms have been removed from a polycycloalkane such as adamantane, norbornane, isobornane, tricyclodecane or tetracyclododecane.

The cyclic, saturated hydrocarbon group may have a substituent. For example, part of the carbon atoms constituting the ring within the cyclic alkyl group may be substituted with a hetero atom, or a hydrogen atom bonded to the ring within the cyclic alkyl group may be substituted with a substituent.

In the former example, a heterocycloalkane in which part of the carbon atoms constituting the ring within the aforementioned monocycloalkane or polycycloalkane has been substituted with a hetero atom such as an oxygen atom, a sulfur atom or a nitrogen atom, and one or more hydrogen atoms have been removed therefrom, can be used. Further, the ring may contain an ester bond (—C(=O)—O—). More specific examples include a lactone-containing monocyclic group, such as a group in which one hydrogen atom has been removed from γ-butyrolactone; and a lactone-containing polycyclic group, such as a group in which one hydrogen atom has been removed from a bicycloalkane, tricycloalkane or tetracycloalkane containing a lactone ring.

In the latter example, as the substituent, the same substituent groups as those for the aforementioned linear or branched alkyl group, or a lower alkyl group can be used.

Alternatively, $R^{6\prime}$, $R^{7\prime}$ and $R^{8\prime}$ may be a combination of a linear or branched alkyl group and a cyclic group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of the linear aliphatic unsaturated hydrocarbon group for $R^{6\prime}$, $R^{7\prime}$ and $R^{8\prime}$ include a vinyl group, a propenyl group (an allyl group) and a butynyl group.

Examples of the branched aliphatic unsaturated hydrocarbon group for $R^{6\prime}$, $R^{7\prime}$ and $R^{8\prime}$ include a 1-methylpropenyl group and a 2-methylpropenyl group.

The aforementioned linear or branched, aliphatic unsaturated hydrocarbon group may have a substituent. Examples of the substituents include the same substituents as those which the aforementioned linear or branched alkyl group may have.

Among the aforementioned examples, as $R^{7\prime}$ and $R^{8\prime}$, in terms of improvement in lithography properties and shape of the resist pattern, a linear or branched, saturated hydrocarbon group of 1 to 15 carbon atoms or a cyclic saturated hydrocarbon group of 3 to 20 carbon atoms is preferable.

The aryl group for each of $R^{1\prime\prime\prime}$ to $R^{3\prime\prime\prime}$ is preferably a phenyl group or a naphthyl group.

Examples of the alkyl group for $R^{1\prime\prime\prime}$ to $R^{3\prime\prime\prime}$ include linear, branched or cyclic alkyl groups of 1 to 10 carbon atoms. Among these, alkyl groups of 1 to 5 carbon atoms are preferable as the resolution becomes excellent. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkenyl group for $R^{1\prime\prime\prime}$ to $R^{3\prime\prime\prime}$ preferably has 2 to 10 carbon atoms, more preferably 2 to 5 carbon atoms, and still more preferably 2 to 4 carbon atoms. Specific examples thereof include a vinyl group, a propenyl group (an allyl group), a butynyl group, a 1-methylpropenyl group and a 2-methylpropenyl group.

When two of $R^{1\prime\prime\prime}$ to $R^{3\prime\prime\prime}$ are bonded to each other to form a ring with the sulfur atom in the formula, it is preferable that the two of $R^{1\prime\prime\prime}$ to $R^{3\prime\prime\prime}$ form a 3 to 10-membered ring including the sulfur atom, and it is particularly desirable that the two of $R^{1\prime\prime\prime}$ to $R^{3\prime\prime\prime}$ form a 5 to 7-membered ring including the sulfur atom.

When two of $R^{1\prime\prime\prime}$ to $R^{3\prime\prime\prime}$ are bonded to each other to form a ring with the sulfur atom in the formula, the remaining one of $R^{1\prime\prime\prime}$ to $R^{3\prime\prime\prime}$ is preferably an aryl group. As examples of the aryl group, the same as the above-mentioned aryl groups for $R^{1\prime\prime\prime}$ to $R^{3\prime\prime\prime}$ can be given.

Specific examples of cation moiety of the compound represented by the above general formula (b-1) include triphenylsulfonium, (3,5-dimethylphenyl)diphenylsulfonium, (4-(2-adamantoxymethyloxy)-3,5-dimethylphenyl) diphenylsulfonium, (4-(2-adamantoxymethyloxy)phenyl) diphenylsulfonium, (4-(tert-butoxycarbonylmethyloxy) phenyl)diphenylsulfonium, (4-(tert-butoxycarbonylmethyloxy)-3,5-dimethylphenyl) diphenylsulfonium, (4-(2-methyl-2-adamantyloxycarbonylmethyloxy)phenyl) diphenylsulfonium, (4-(2-methyl-2-adamantyloxycarbonylmethyloxy)- 3,5-dimethylphenyl) diphenylsulfonium, tri(4-methylphenyl)sulfonium, dimethyl (4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl) phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl) tetrahydrothiopyranium and 1-(4-methylphenyl)tetrahydrothiopyranium.

Further, specific examples of the preferred cation moiety for the compound represented by the above formula (b-1) include cation moieties shown below.

[Chemical Formula 38]

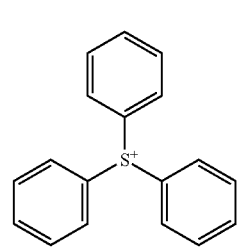

(b-1-1)

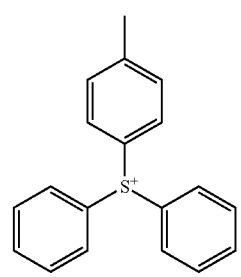

(b-1-2)

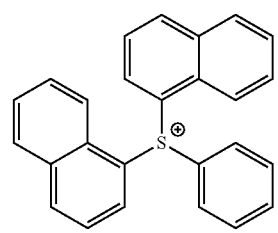

(b-1-3)

[Chemical Formula 39]

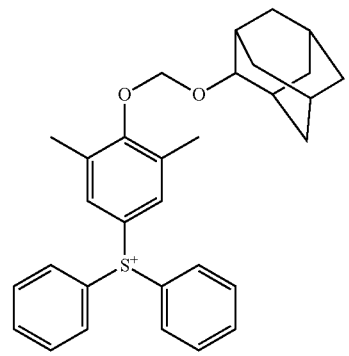

(b-1-4)

(b-1-5)
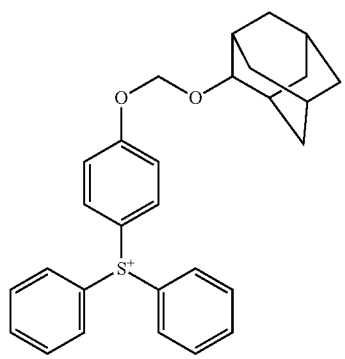
(b-1-9)
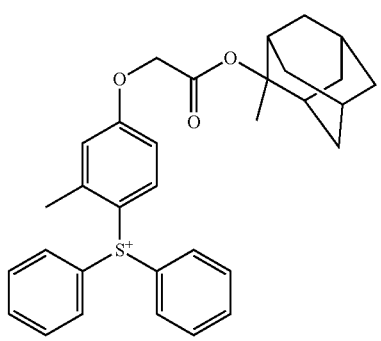
(b-1-6)
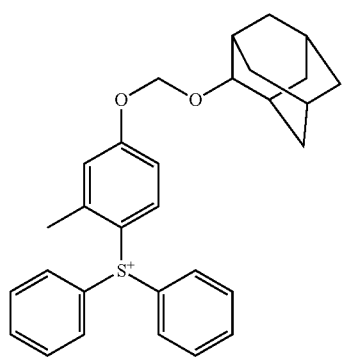
[Chemical Formula 40]
(b-1-10)
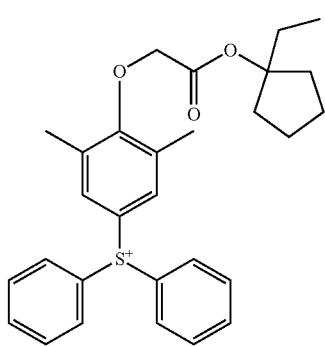
(b-1-7)
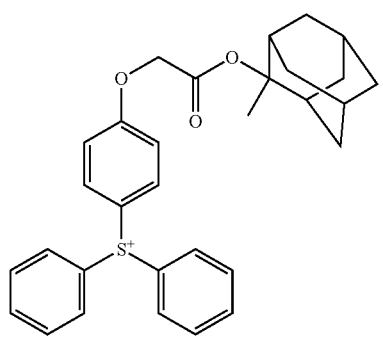
(b-1-11)
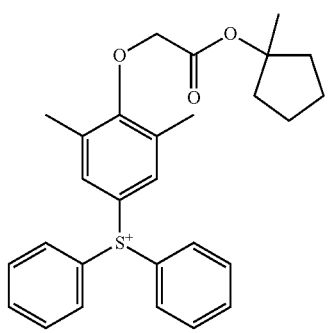
(b-1-8)
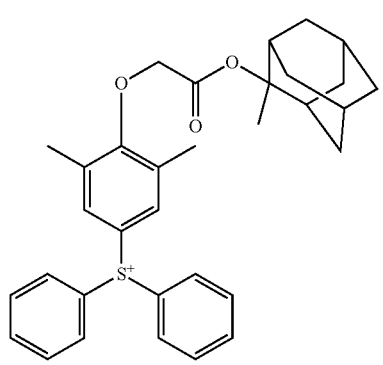
(b-1-12)
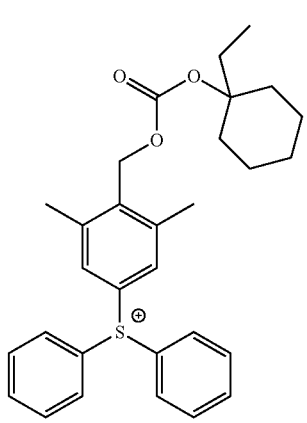

(b-1-13) 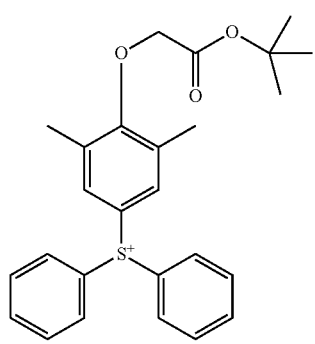
(b-1-14) 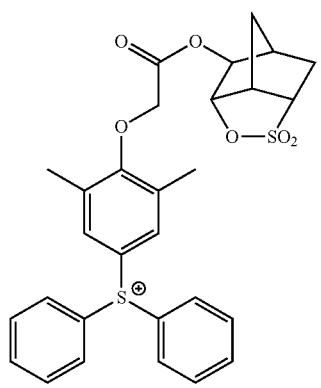
(b-1-15) 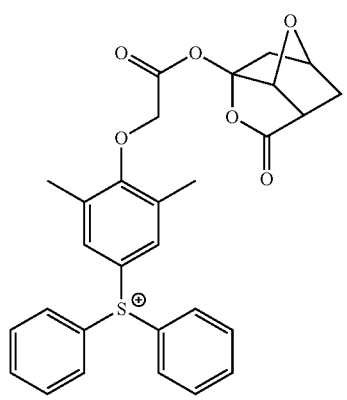
(b-1-16) 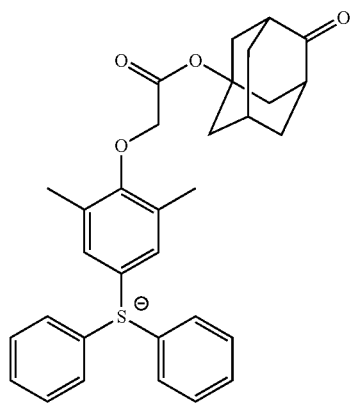
(b-1-17) 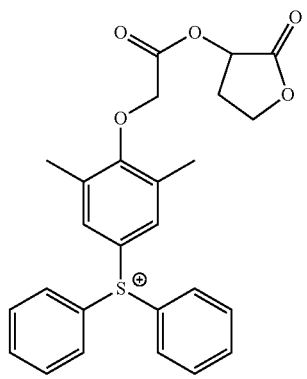
(b-1-18) 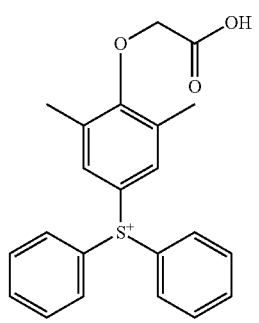
(b-1-19) 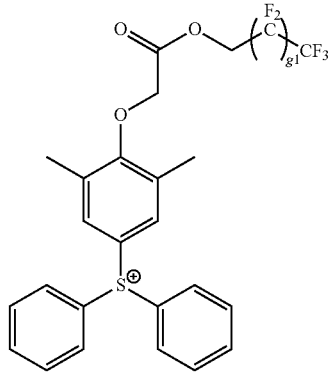
In the formula, g1 represents a recurring number, and is an integer of 1 to 5.
[Chemical Formula 42]
(b-1-20) 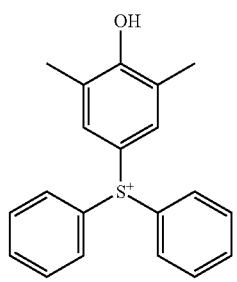

(b-1-21)
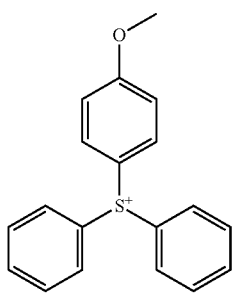
(b-1-22)
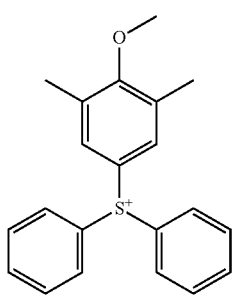
[Chemical Formula 43]
(b-1-23)
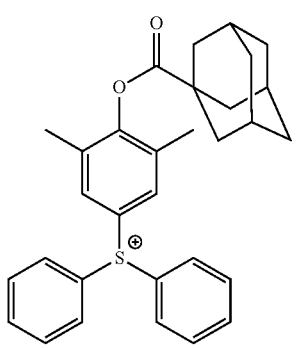
(b-1-24)
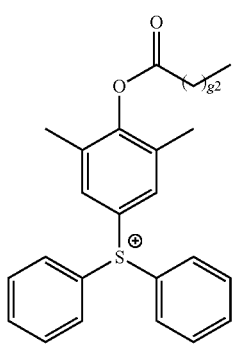
(b-1-25)
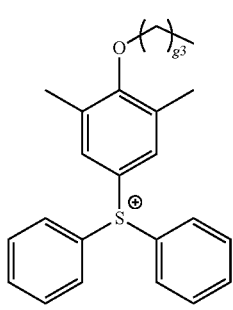
In the formula, g2 and g3 represent recurring numbers, wherein g2 is an integer of 0 to 20, and g3 is an integer of 0 to 20.
[Chemical Formula 44]
(b-1-26)
(b-1-27)
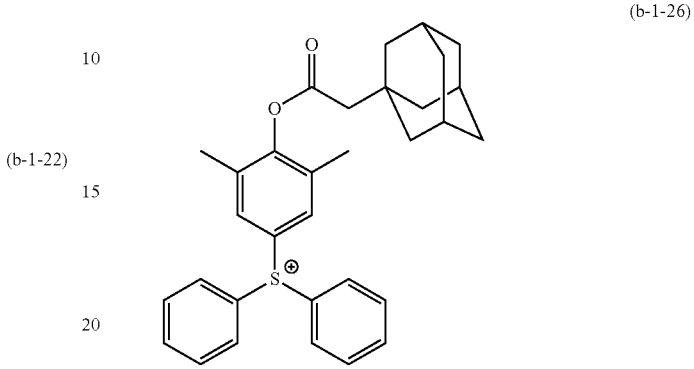
(b-1-28)
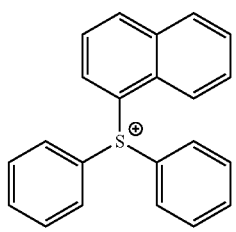
[Chemical Formula 45]
(b-1-29)
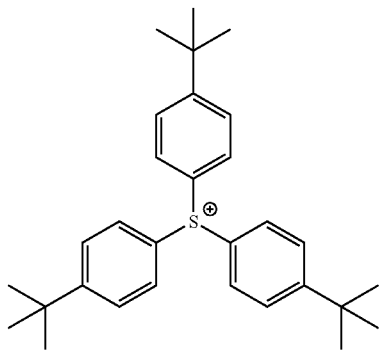

-continued (b-1-30)

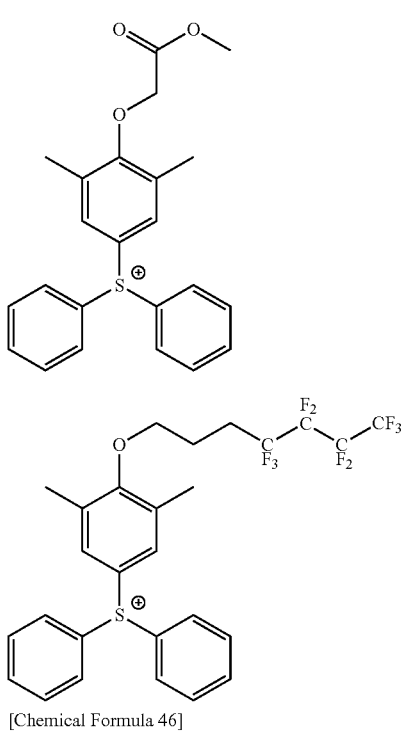

(b-1-31)

(b-1-32)

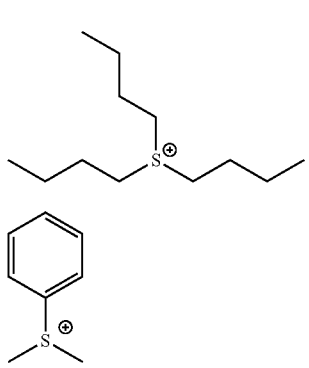

[Chemical Formula 46]

(b-1-33)

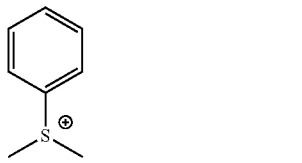

In the above formula (b-1), $R^{4'''}$ represents an alkyl group which may have a substituent, a halogenated alkyl group, an aryl group or an alkenyl group.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4'''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratios are preferable, as they result in increased acid strength.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X^b$-$Q^1$- (in the formula, $Q^1$ represents a divalent linking group containing an oxygen atom; and $X^b$ represents a hydrocarbon group of 3 to 30 carbon atoms which may have a substituent).

Examples of halogen atoms and alkyl groups as substituents for $R^{4'''}$ include the same halogen atoms and alkyl groups as those described above with respect to the halogenated alkyl group for $R^{4'''}$.

Examples of the hetero atom include an oxygen atom, a nitrogen atom, and a sulfur atom.

In the group represented by formula $X^b$-$Q^1$-, $Q^1$ represents a divalent linking group containing an oxygen atom.

$Q^1$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amide bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and most preferably 1 to 3 carbon atoms.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

$Q^1$ is preferably a divalent linking group containing an ester bond or ether bond, and more preferably a group represented by —$R^{91}$—O—, —$R^{92}$—O—C(=O)— or —C(=O)—O—$R^{93}$—O—C(=O)—.

In the group represented by the formula $X^b$-$Q^1$-, the hydrocarbon group for $X^b$ may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2 carbon atoms, and most preferably 1 carbon atom.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned hetero atom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, an ethoxy group, a n-propoxy group, an iso-propoxy group, a n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for $X^b$ may be either a saturated aliphatic hydrocarbon group, or an unsaturated aliphatic hydrocarbon group. Further, the aliphatic hydrocarbon group may be linear, branched or cyclic.

In the aliphatic hydrocarbon group for $X^b$, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for $X^b$, there is no particular limitation as long as it is an atom other than carbon and hydrogen, and examples thereof include a halogen atom, an oxygen atom, a sulfur atom and a nitrogen atom.

Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, a n-propoxy group, an iso-propoxy group, a n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L6) and (S1) to (S4) shown below.

[Chemical Formula 47]

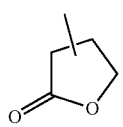

(L1)

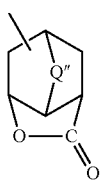

(L2)

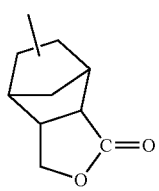

(L3)

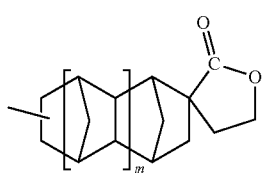

(L4)

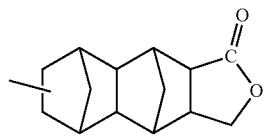

(L5)

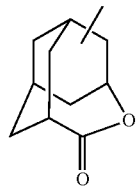

(L6)

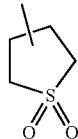

(S1)

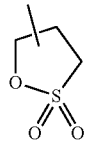

(S2)

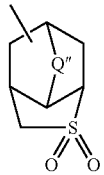

(S3)

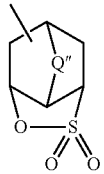

(S4)

In the formulas, Q″ represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents an integer of 0 or 1.

As the alkylene group for Q″, R$^{94}$ and R$^{95}$, the same alkylene groups as those described above for R$^{91}$ to R$^{93}$ can be used.

In these aliphatic cyclic groups, part of the hydrogen atoms bonded to the carbon atoms constituting the ring structure may be substituted with a substituent. Examples of the substituent include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

Among the examples described above, as X$^b$, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by the above formulas (L2) to (L5), (S3) and (S4) are preferable.

Further, it is particularly desirable that $X^b$ have a polar moiety, because it results in improved lithographic properties and resist pattern shape.

Specific examples of $X^b$ having a polar moiety include those in which a part of the carbon atoms constituting the aliphatic hydrocarbon group for $X^b$ is substituted with a substituent group containing a hetero atom such as —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—.

Among the various possibilities described above, $R^{4'''}$ preferably has $X^b$-$Q^1$- as a substituent. In such a case, $R^{4'''}$ is preferably a group represented by the formula $X^b$-$Q^1$-$Y^1$— (in the formula, $Q^1$ and $X^b$ are the same as defined above; and $Y^1$ represents an alkylene group of 1 to 4 carbon atoms which may have a substituent, or a fluorinated alkylene group of 1 to 4 carbon atoms which may have a substituent).

In the group represented by the formula $X^b$-$Q^1$-$Y^1$—, as the alkylene group for $Y^1$, the same alkylene group as those described above for $Q^1$ in which the number of carbon atoms is 1 to 4 can be used.

As the fluorinated alkylene group for $Y^1$, the aforementioned alkylene group in which part or all of the hydrogen atoms has been substituted with fluorine atoms can be used.

Specific examples of $Y^1$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CF$_2$CF$_2$—, —CH$_2$CF$_2$CF$_2$CF$_2$—; —CH$_2$CH$_2$CF$_2$—, —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The expression that the alkylene group or fluorinated alkylene group "may have a substituent" means that some or all of the hydrogen atoms or fluorine atoms in the alkylene group or fluorinated alkylene group may be substituted, either with atoms other than hydrogen atoms and fluorine atoms, or with groups.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2) above, each of $R^{5'''}$ and $R^{6'''}$ independently represents an aryl group which may have a substituent, an alkyl group or an alkenyl group.

Further, at least one of $R^{5'''}$ and $R^{6'''}$ preferably represents an aryl group, and it is particularly desirable that all of $R^{5'''}$ and $R^{6'''}$ be aryl groups, as such groups yield superior improvements in the lithography properties and resist pattern shape.

As the aryl group for $R^{5'''}$ and $R^{6'''}$, the same aryl groups as those described above for $R^{1'''}$ to $R^{3'''}$ can be used.

As the alkyl group for $R^{5'''}$ and $R^{6'''}$, the same alkyl groups as those described above for $R^{1'''}$ to $R^{3'''}$, can be used.

As the alkenyl group for $R^{5'''}$, and $R^{6'''}$, the same alkenyl groups as those described above for $R^{1'''}$ to $R^{3'''}$ can be used.

It is particularly desirable that both of $R^{5'''}$ and $R^{6'''}$ represents a phenyl group.

Specific examples of the cation moiety of the compound represented by the above general formula (b-2) include diphenyliodonium and bis(4-tert-butylphenyl)iodonium.

As $R^{4'''}$ in the above formula (b-2), the same groups as those mentioned above for $R^{4'''}$ in formula (b-1) can be used.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate such as methanesulfonate, n-propanesulfonate, n-butanesulfonate, n-octanesulfonate, 1-adamantanesulfonate, or 2-norbornanesulfonate; or a sulfonate such as d-camphor-10-sulfonate, benzenesulfonate, perfluorobenzenesulfonate, or p-toluenesulfonate.

Furthermore, onium salts in which the anion moiety of these onium salts is replaced by an anion moiety represented by any one of formulas (b1) to (b8) shown below can also be used.

[Chemical Formula 48]

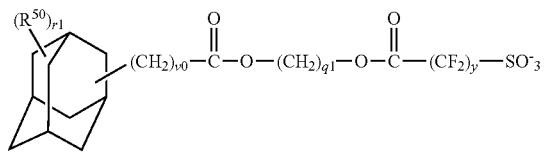
(b1)

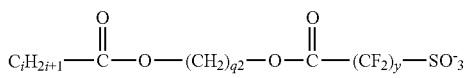
(b2)

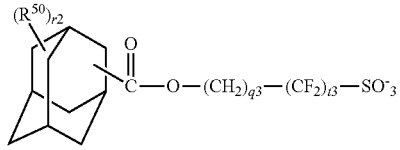
(b3)

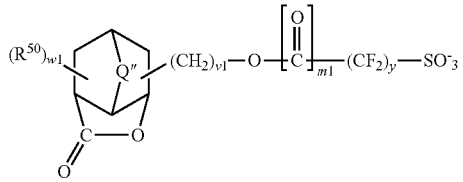
(b4)

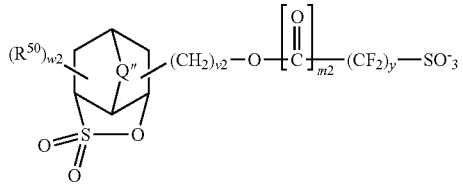
(b5)

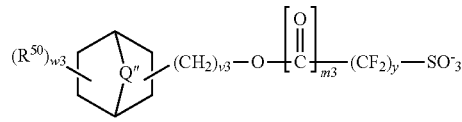
(b6)

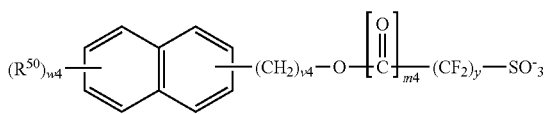
(b7)

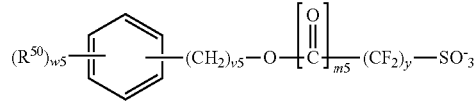
(b8)

In the formulas, y represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; i represents an integer of 1 to 20; $R^{50}$ represents a substituent; each of m1 to m5 independently represents 0 or 1; each of v0 to v5 independently represents an integer of 0 to 3; each of w1 to w5 independently represents an integer of 0 to 3; and Q" is the same as defined above.

As the substituent for $R^{50}$, the same groups as those which the aforementioned aliphatic hydrocarbon group or aromatic hydrocarbon group for $X^b$ may have as a substituent can be used.

If there are two or more of the $R^{50}$ groups, as indicated by the values r1, r2, and w1 to w5, then the two or more of the $R^{50}$ groups may be the same or different from each other.

Further, onium salt-based acid generators in which the anion moiety in general formula (b-1) or (b-2) ($R^{4''}SO_3^-$) is replaced by an anion represented by general formula (b-3) or (b-4) shown below (the cation moiety is the same as the cation moiety in the aforementioned formula (b-1) or (b-2)) may be used.

[Chemical Formula 49]

(b-3)

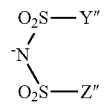
(b-4)

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all the hydrogen atoms are substituted with fluorine atoms.

Further, an onium salt-based acid generator in which the anion moiety ($R^{4"}SO_3^-$) in general formula (b-1) or (b-2) has been replaced with $R^a$—$COO^-$ (in the formula, $R^a$ represents an alkyl group or a fluorinated alkyl group) can also be used (the cation moiety is the same as that in general formula (b-1) or (b-2)).

In the formula above, as $R^a$, the same groups as those described above for $R^{4"}$, can be used.

Specific examples of the group represented by the formula "$R^a$—$COO^-$" include a trifluoroacetic acid ion, an acetic acid ion, and a 1-adamantanecarboxylic acid ion.

Furthermore, as an onium salt-based acid generator, a sulfonium salt having a cation represented by general formula (b-5) or (b-6) shown below as the cation moiety may also be used.

[Chemical Formula 50]

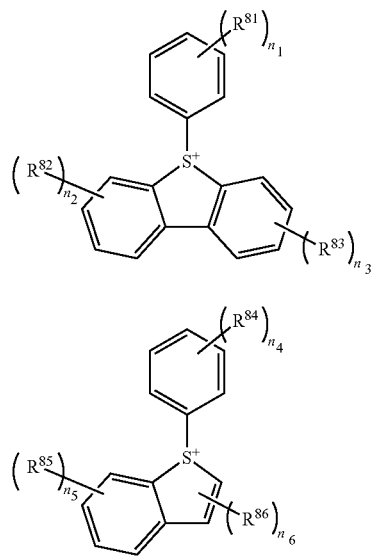

(b-5)

(b-6)

In formulas (b-5) and (b-6) above, each of $R^{81}$ to $R^{86}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{81}$ to $R^{86}$, the alkyl group is preferably an alkyl group of 1 to 5 carbon atoms, more preferably a linear or branched alkyl group, and most preferably a methyl group, an ethyl group, a propyl group, an isopropyl group, a n-butyl group or a tert-butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{81}$ to $R^{86}$ group, as indicated by the corresponding value of $n_1$ to $n_6$, then the two or more of the individual $R^{81}$ to $R^{86}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Preferable examples of the cation represented by the above formula (b-5) or (b-6) are shown below.

[Chemical Formula 51]

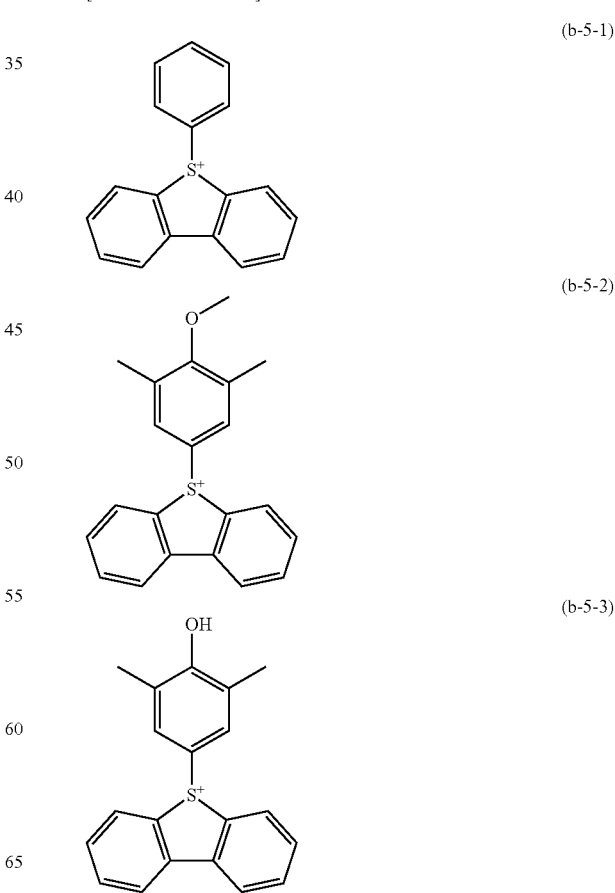

(b-5-1)

(b-5-2)

(b-5-3)

(b-5-4)

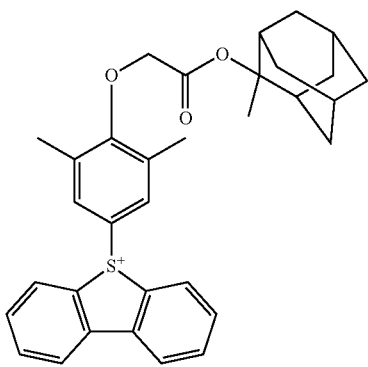

(b-5-5)

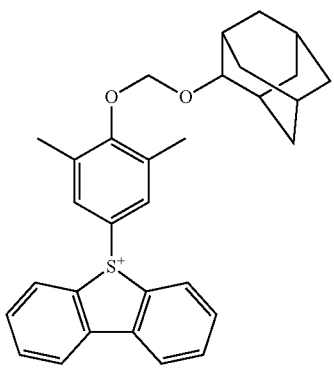

(b-5-6)

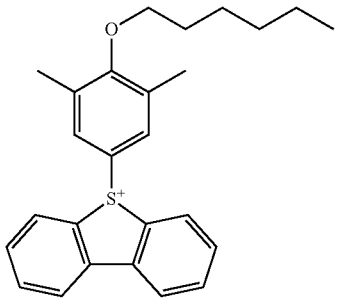

(b-6-1)

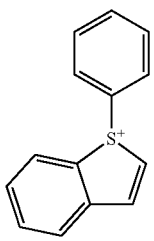

(b-6-2)

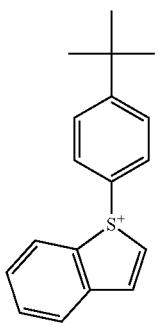

Furthermore, a sulfonium salt having a cation represented by general formula (b-7) or (b-8) shown below as the cation moiety may also be used.

[Chemical Formula 52]

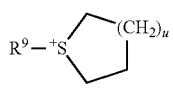

(b-7)

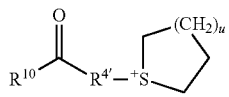

(b-8)

In formulas (b-7) and (b-8), each of $R^9$ and $R^{10}$ independently represents a phenyl group or naphthyl group which may have a substituent, an alkyl group of 1 to 5 carbon atoms, an alkoxy group or a hydroxyl group. Examples of the substituent are the same as the substituents described above in relation to the substituted aryl group for $R^{1\prime\prime\prime}$ to $R^{3\prime\prime\prime}$ (i.e., an alkyl group, an alkoxy group, an alkoxyalkyloxy group, an alkoxycarbonylalkyloxy group, a halogen atom, a hydroxyl group, an oxo group (=O), an aryl group, —C(=O)—O—$R^{6\prime}$, —O—C(=O)—$R^{7\prime}$, —O—$R^{8\prime}$, a group in which $R^{56}$ in the aforementioned general formula —O—$R^{50}$—C(=O)—O—$R^{56}$ has been substituted with $R^{56\prime}$).

$R^{4\prime}$ represents an alkylene group of 1 to 5 carbon atoms.

u represents an integer of 1 to 3, and is most preferably 1 or 2.

Preferable examples of the cation represented by the above formula (b-7) or (b-8) are shown below. In the formulas, $R^c$ is the same as the substituents described above in relation to the substituted aryl group (i.e., an alkyl group, an alkoxy group, an alkoxyalkyloxy group, an alkoxycarbonylalkyloxy group, a halogen atom, a hydroxyl group, an oxo group (=O), an aryl group, —C(=O)—O—$R^{6\prime}$, —O—C(=O)—$R^{7\prime}$ and —O—$R^{8\prime}$).

[Chemical Formula 53]

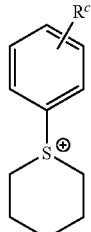

(b-7-1)

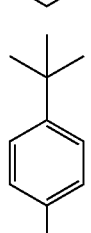

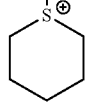

(b-7-2)

-continued (b-7-3)

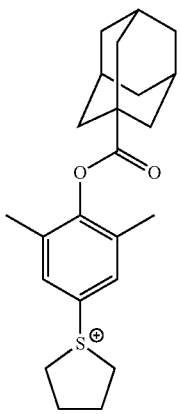

(b-7-4)

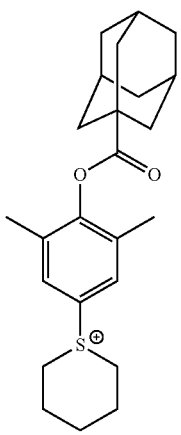

(b-7-5)

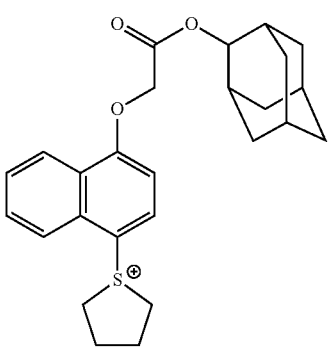

[Chemical Formula 54]

(b-8-1)

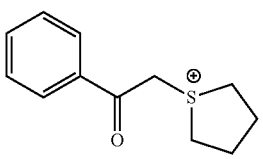

-continued (b-8-2)

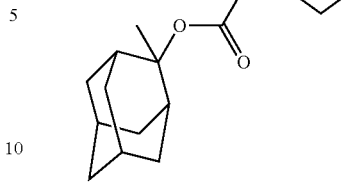

The anion moiety of the sulfonium salt having a cation represented by general formulas (b-5) to (b-8) for the cation moiety is not particularly limited, and the same anion moieties for onium salt-based acid generators which have been proposed may be used. Examples of such anion moieties include fluorinated alkylsulfonic acid ions such as anion moieties ($R^{4\prime\prime\prime}SO_3^-$) for onium salt-based acid generators represented by general formula (b-1) or (b-2) shown above; anion moieties represented by general formula (b-3) or (b-4) shown above; and anion moieties represented by any one of formulas (b1) to (b8) shown above.

In the present description, an oxime sulfonate-based acid generator is a compound having at least one group represented by general formula (B-1) shown below, and has a feature of generating acid by irradiation (exposure). Such oxime sulfonate-based acid generators are widely used for a chemically amplified resist composition, and can be appropriately selected.

[Chemical Formula 55]

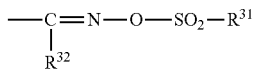

(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group, or a cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 56]

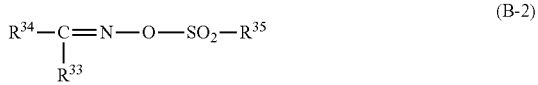

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 57]

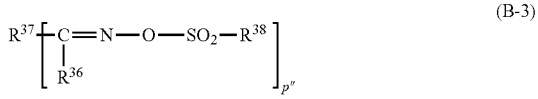

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be used.

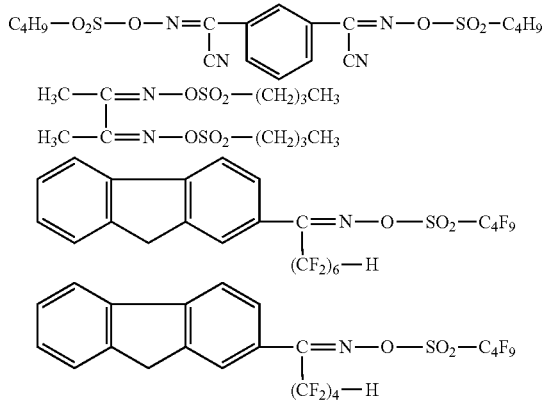

[chemical Formula 58]

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of these acid generators may be used alone, or two or more types may be used in combination.

The amount of the component (B) within the resist composition is preferably 0.5 to 60 parts by weight, more preferably 1 to 50 parts by weight, and still more preferably 1 to 40 parts by weight, relative to 100 parts by weight of the component (A). When the amount of the component (B) is within the above-mentioned range, formation of a resist pattern can be satisfactorily performed. Further, by virtue of the above-mentioned range, when each component of the resist composition is dissolved in an organic solvent, a uniform solution can be obtained and the storage stability tends to improve, which is desirable.

In the present invention, the resist composition may contain a nitrogen-containing organic compound component (D) (hereafter, referred to as the component (D)), other than the aforementioned components (A) and (B), as long as the effects of the present invention are not impaired.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used. Examples thereof include amines such as aliphatic amines and aromatic amines. Among these, an aliphatic amine is preferable, and a secondary aliphatic amine or tertiary aliphatic amine is particularly desirable.

An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (i.e., alkylamines or alkylalcoholamines), and cyclic amines.

The alkyl group for the above alkyl groups and hydroxyalkyl groups may be any of linear, branched or cyclic.

When the alkyl group is linear or branched, the number of carbon atoms thereof is preferably 2 to 20, and more preferably 2 to 8.

When the alkyl group is cyclic (i.e., a cycloalkyl group), the number of carbon atoms is preferably 3 to 30, more preferably 3 to 20, still more preferably 3 to 15, still more preferably 4 to 12, and most preferably 5 to 10. The alkyl group may be monocyclic or polycyclic. Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples of the monocycloalkane include cyclopentane and cyclohexane. Further, specific examples of the polycycloalkane include adamantane, norbornane, isobornane, tricyclodecane and tetracyclododecane.

Specific examples of the alkylamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; and trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine.

Specific examples of the alkylalcoholamines include diethanolamine, triethanolamine, diisopropanolamine, triisopropanolamine, di-n-octanolamine, tri-n-octanolamine, stearyldiethanolamine and lauryldiethanolamine.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris {2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine and tris [2-{2-(2-hydroxyethoxy)ethoxy}ethyl]amine.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

These compounds can be used either alone, or in combinations of two or more different compounds.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

Furthermore, in the present invention, for preventing any deterioration in sensitivity, and improving the resist pattern shape and the post exposure stability of the latent image formed by the pattern-wise exposure of the resist layer, the resist composition may contain at least one compound (E) (hereafter referred to as "component (E)") selected from the group consisting of organic carboxylic acids, and phosphorus oxo acids and derivatives thereof as an optional component.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid, and among these, phosphonic acid is particularly desirable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

In the present invention, if desired, other miscible additives can also be added to the resist composition. Examples of such miscible additives include additive resins for improving the performance of the resist film, surfactants for improving the applicability, dissolution inhibitors, plasticizers, stabilizers, colorants, halation prevention agents, and dyes.

In the present invention, the resist composition can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These organic solvents can be used individually, or as a mixed solvent containing two or more different solvents.

Among these, propylene glycol monomethyl ether acetate (PGMEA), propylene glycol monomethyl ether (PGME), cyclohexanone and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, and more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3. Alternatively, when PGME and cyclohexanone are mixed as the polar solvents, the PGMEA:(PGME+cyclohexanone) weight ratio is preferably from 1:9 to 9:1, more preferably from 2:8 to 8:2, and still more preferably from 3:7 to 7:3.

Further, as the component (S), a mixed solvent of γ-butyrolactone is also preferable, which is obtained by mixing with PGMEA, EL or the aforementioned mixed solvent of PGMEA and a polar solvent. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

According to the method of forming a resist pattern of the present invention, a very fine resist pattern with excellent lithography properties can be formed by a positive development process.

In the method of forming a resist pattern according to the present invention, a positive development process is employed by combining the resist composition containing the resin component (A1) that contains the structural unit (a1) containing an acid decomposable group which exhibits increased polarity by the action of acid, with the developing solution containing a polar organic solvent.

If the resist film formed using the resist composition is selectively exposed, the acid decomposable group in the structural unit (a1) is decomposed by the action of acid to form a polar group within the exposed portions. As a result, it is thought that because the compatibility of the resin component (A1) with the developing solution is improved when conducting development, the exposed portions of the resist film are dissolved and removed to be resolved. In addition, because an excellent contrast between the exposed portions and the unexposed portions can be readily achieved, various lithography properties including the roughness reduction can be improved. Further, in the present invention, a developing solution containing a polar organic solvent is used. Because polar organic solvents have a low surface tension compared to water, unlike aqueous alkali solutions, the swelling and collapse of resist patterns are suppressed, so that resist patterns can be stably formed.

EXAMPLES

As follows is a more detailed description of the present invention based on a series of examples, although the scope of the present invention is in no way limited by these examples.

In the following examples, a unit represented by a chemical formula (1) is referred to as "compound (1)", and the same applies for compounds represented by other formulas.

Component (A1) Synthesis Example 1

Synthesis of Polymeric Compound (1)

In a separable flask equipped with a thermometer, a reflux tube and a nitrogen feeding pipe, 10.00 g (58.77 mmol) of a compound (1), 29.42 g (117.54 mmol) of a compound (2) and 4.63 g (19.59 mmol) of a compound (3) were dissolved in 56.60 g of methyl ethyl ketone (MEK). Then, 22.52 mmol of dimethyl 2,2'-azobis(isobutyrate) (product name: V-601) as a polymerization initiator was added and dissolved in the resulting solution.

The resultant was dropwise added to 30.70 g of MEK heated to 80° C. in a nitrogen atmosphere over 4 hours. Following dropwise addition, the resulting reaction solution was heated while stiffing for 1 hour, and then cooled to room temperature.

The obtained reaction polymer solution was dropwise added to an excess amount of methanol to deposit a polymer. Thereafter, the precipitated white powder was separated by filtration, followed by washing with methanol and drying, thereby obtaining 26.4 g of a polymeric compound (1) as an objective compound.

With respect to this polymeric compound (1), the weight average molecular weight (Mw) and the dispersity (Mw/Mn) were determined by the polystyrene equivalent value as measured by gel permeation chromatography (GPC). As a result, it was found that the weight average molecular weight was 8,300, and the dispersity was 1.96. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m/n=30.8/53.7/15.5.

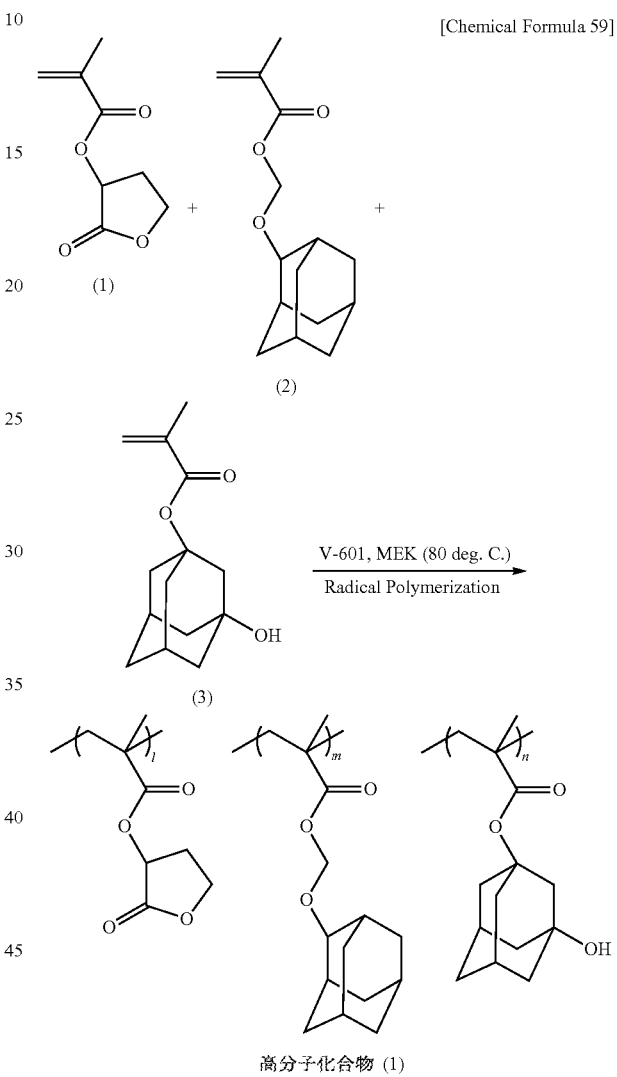

[Chemical Formula 59]

Component (A1) Synthesis Examples 2 to 18

Synthesis of Polymeric Compounds (2) to (18)

Polymeric compounds (2) to (18) were synthesized by the same method as described above in the Component (A1) Synthesis Example 1 with the exception that the following compounds (1) to (15) that give rise to the structural units constituting the respective polymeric compounds were used at a predetermined molar ratio.

With respect to each polymeric compound, the compounds for deriving the respective structural units, the composition of the copolymer as determined by carbon 13 nuclear magnetic resonance spectroscopy (600 MHz, $^{13}$C-NMR), and the weight average molecular weight (Mw) and the dispersity (Mw/Mn) in terms of the polystyrene equivalent value measured by gel permeation chromatography (GPC) are shown in Table 1.
[Chemical Formula 60]
(1)
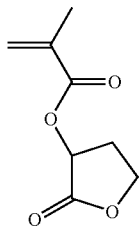
(2)
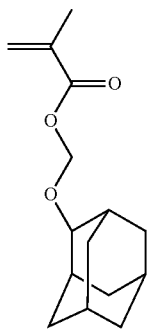
(3)
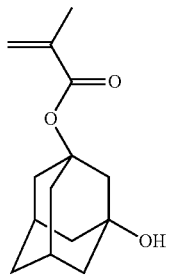
(4)
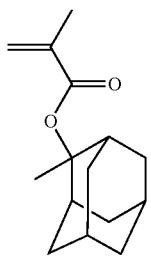
(5)
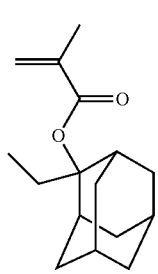
(6)
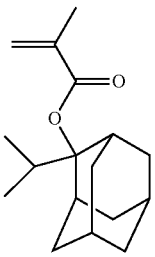
(7)
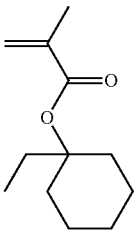
(8)
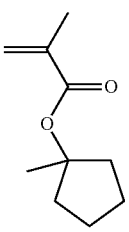
(9)
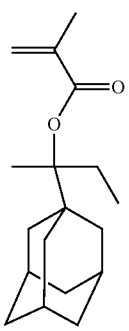
(10)
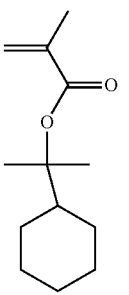

(11) 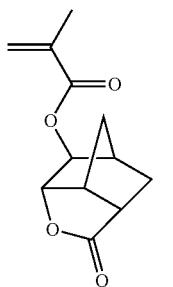

(12) 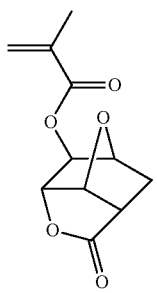

(13) 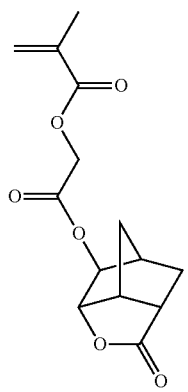

(14) 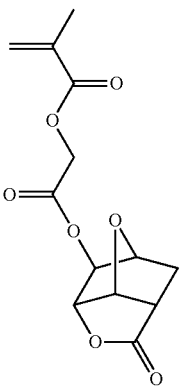

(15) 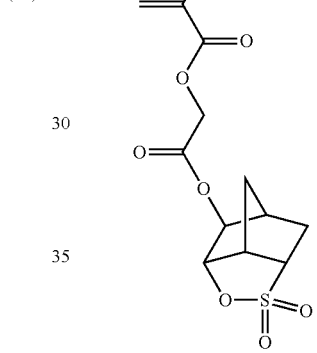

TABLE 1

| | Compounds for deriving each structural unit | Copolymer compositional ratio | Mw | Mw/Mn |
|---|---|---|---|---|
| Polymeric compound 1 | (1)/(2)/(3) | 30.8/53.7/15.5 | 8,300 | 1.96 |
| Polymeric compound 2 | (1)/(4)/(3) | 30.2/58.2/11.6 | 7,900 | 1.64 |
| Polymeric compound 3 | (11)/(4)/(3) | 30.1/57.5/12.4 | 7,400 | 1.62 |
| Polymeric compound 4 | (12)/(4)/(3) | 30.3/57.8/11.9 | 7,500 | 1.62 |
| Polymeric compound 5 | (13)/(4)/(3) | 32.4/57.0/10.6 | 8,200 | 1.63 |
| Polymeric compound 6 | (14)/(4)/(3) | 31.0/58.1/10.9 | 8,200 | 1.65 |
| Polymeric compound 7 | (15)/(4)/(3) | 30.4/58.4/11.2 | 7,800 | 1.60 |
| Polymeric compound 8 | (15)/(5)/(3) | 31.1/57.8/11.1 | 7,400 | 1.59 |
| Polymeric compound 9 | (15)/(6)/(3) | 32.4/56.7/10.9 | 7,500 | 1.63 |
| Polymeric compound 10 | (15)/(6)/(3) | 41.9/42.5/15.6 | 7,200 | 1.61 |
| Polymeric compound 11 | (15)/(7)/(3) | 31.7/57.2/11.1 | 8,000 | 1.65 |
| Polymeric compound 12 | (1)/(6)/(5)/(3) | 31.4/42.1/6.5/20.0 | 8,600 | 1.66 |
| Polymeric compound 13 | (15)/(6)/(5)/(3) | 30.6/43.5/5.4/20.5 | 8,400 | 1.67 |
| Polymeric compound 14 | (1)/(15)/(6)/(4)/(3) | 10.4/20.5/40.2/15.2/13.7 | 8,900 | 1.65 |
| Polymeric compound 15 | (1)/(15)/(6)/(5)/(3) | 10.3/20.4/40.8/15.0/13.5 | 8,500 | 1.65 |
| Polymeric compound 16 | (1)/(15)/(6)/(8)/(3) | 10.7/19.8/40.5/14.8/14.2 | 8,400 | 1.63 |
| Polymeric compound 17 | (1)/(15)/(6)/(7)/(3) | 10.9/19.4/40.7/14.9/14.1 | 8,200 | 1.61 |
| Polymeric compound 18 | (1)/(15)/(9)/(10)/(3) | 10.1/19.0/42.3/15.2/13.4 | 8,000 | 1.58 |

<Preparation of Resist Compositions>

The components shown in Table 2 were mixed together and dissolved to prepare resist compositions (1) to (18).

TABLE 2

| | Component (A) | Component (B) | | Component (D) | Component (E) | Component (S) | |
|---|---|---|---|---|---|---|---|
| Resist composition (1) | (A)-1 [100] | (B)-1 [6.7] | (B)-2 [2.6] | (D)-1 [0.6] | (E)-1 [0.75] | (S)-1 [1,590] | (S)-2 [1,060] |
| Resist composition (2) | (A)-2 [100] | (B)-1 [6.7] | (B)-2 [2.6] | (D)-1 [0.6] | (E)-1 [0.75] | (S)-1 [1,590] | (S)-2 [1,060] |
| Resist composition (3) | (A)-3 [100] | (B)-1 [6.7] | (B)-2 [2.6] | (D)-1 [0.6] | (E)-1 [0.75] | (S)-1 [1,590] | (S)-2 [1,060] |
| Resist composition (4) | (A)-4 [100] | (B)-1 [6.7] | (B)-2 [2.6] | (D)-1 [0.6] | (E)-1 [0.75] | (S)-1 [1,590] | (S)-2 [1,060] |
| Resist composition (5) | (A)-5 [100] | (B)-1 [6.7] | (B)-2 [2.6] | (D)-1 [0.6] | (E)-1 [0.75] | (S)-1 [1,590] | (S)-2 [1,060] |
| Resist composition (6) | (A)-6 [100] | (B)-1 [6.7] | (B)-2 [2.6] | (D)-1 [0.6] | (E)-1 [0.75] | (S)-1 [1,590] | (S)-2 [1,060] |
| Resist composition (7) | (A)-7 [100] | (B)-1 [6.7] | (B)-2 [2.6] | (D)-1 [0.6] | (E)-1 [0.75] | (S)-1 [1,590] | (S)-2 [1,060] |
| Resist composition (8) | (A)-8 [100] | (B)-1 [6.7] | (B)-2 [2.6] | (D)-1 [0.6] | (E)-1 [0.75] | (S)-1 [1,590] | (S)-2 [1,060] |
| Resist composition (9) | (A)-9 [100] | (B)-1 [6.7] | (B)-2 [2.6] | (D)-1 [0.6] | (E)-1 [0.75] | (S)-1 [1,590] | (S)-2 [1,060] |
| Resist composition (10) | (A)-10 [100] | (B)-1 [6.7] | (B)-2 [2.6] | (D)-1 [0.6] | (E)-1 [0.75] | (S)-1 [1,590] | (S)-2 [1,060] |
| Resist composition (11) | (A)-11 [100] | (B)-1 [6.7] | (B)-2 [2.6] | (D)-1 [0.6] | (E)-1 [0.75] | (S)-1 [1,590] | (S)-2 [1,060] |
| Resist composition (12) | (A)-12 [100] | (B)-1 [6.7] | (B)-2 [2.6] | (D)-1 [0.6] | (E)-1 [0.75] | (S)-1 [1,590] | (S)-2 [1,060] |
| Resist composition (13) | (A)-13 [100] | (B)-1 [6.7] | (B)-2 [2.6] | (D)-1 [0.6] | (E)-1 [0.75] | (S)-1 [1,590] | (S)-2 [1,060] |
| Resist composition (14) | (A)-14 [100] | (B)-1 [6.7] | (B)-2 [2.6] | (D)-1 [0.6] | (E)-1 [0.75] | (S)-1 [1,590] | (S)-2 [1,060] |
| Resist composition (15) | (A)-15 [100] | (B)-1 [6.7] | (B)-2 [2.6] | (D)-1 [0.6] | (E)-1 [0.75] | (S)-1 [1,590] | (S)-2 [1,060] |
| Resist composition (16) | (A)-16 [100] | (B)-1 [6.7] | (B)-2 [2.6] | (D)-1 [0.6] | (E)-1 [0.75] | (S)-1 [1,590] | (S)-2 [1,060] |
| Resist composition (17) | (A)-17 [100] | (B)-1 [6.7] | (B)-2 [2.6] | (D)-1 [0.6] | (E)-1 [0.75] | (S)-1 [1,590] | (S)-2 [1,060] |
| Resist composition (18) | (A)-18 [100] | (B)-1 [6.7] | (B)-2 [2.6] | (D)-1 [0.6] | (E)-1 [0.75] | (S)-1 [1,590] | (S)-2 [1,060] |

In Table 2, the values in brackets [ ] indicate the amount (in terms of parts by weight) of the component added, and the reference characters indicate the following.

(A)-1 to (A)-18: the aforementioned polymeric compounds (1) to (18)

(B)-1: a compound represented by chemical formula (B)-1 shown below (B)-2: a compound represented by chemical formula (B)-2 shown below

[Chemical Formula 61]

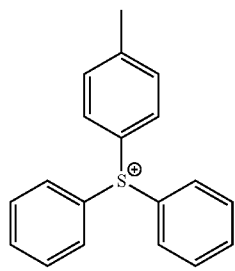

(B)-1

-continued

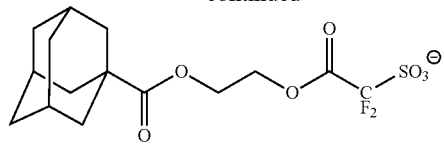

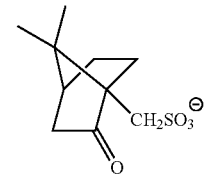

(B)-2

(D)-1: tri-n-pentylamine
(E)-1: salicylic acid
(S)-1: propylene glycol monomethyl ether acetate
(S)-2: propylene glycol monomethyl ether <Formation of Resist Pattern by Positive Development Process>

Examples 1 to 21

Comparative Examples 1 to 18

An organic antireflection film composition (product name: ARC29A, manufactured by Brewer Science Ltd.) was applied onto an 8-inch silicon wafer using a spinner, and the composition was then baked and dried on a hotplate at 205° C. for 60 seconds, thereby forming an organic antireflection film having a thickness of 82 nm.

Each of the resist compositions prepared as described above was applied onto the antireflection film using a spinner, and was then prebaked (PAB) on a hotplate at the baking temperature (PAB, ° C.) indicated in Tables 3 to 7 for 60 seconds and dried, thereby forming a resist film having a film thickness of 140 nm.

Subsequently, the resist film was selectively irradiated with an ArF excimer laser (193 nm), through a photomask (6% half tone) targeting a line and space pattern (hereafter, referred to as "LS pattern") with a line width of 160 nm and a pitch of 320 nm, using an ArF exposure apparatus NSR-S302 (manufactured by Nikon Corporation, NA (numerical aperture)=0.60, ⅔ annular illumination).

Thereafter, a post exposure bake (PEB) treatment was conducted at each of the temperatures indicated in Tables 3 to 7 (PEB, ° C.) for 60 seconds, followed by development for 60 seconds at 23° C. in the respective developing solutions indicated in Tables 3 to 7. Then, only in the cases of Comparative Examples, the resist film was rinsed for 60 seconds at 23° C. with pure water, and then spun dry.

As a result, in each of the examples, the exposed portions of the resist film were dissolved and removed, thereby forming a line and space pattern (LS pattern) in which lines having a line width of 160 nm were spaced at equal intervals (pitch: 320 nm). The optimum exposure dose Eop (mJ/cm$^2$) with which the LS pattern was formed is shown in Tables 3 to 7.

In the tables, the expressions "MeOH", "EtOH", "IPA" and "TMAH" indicate methanol, ethanol, isopropyl alcohol and a 2.38% by weight aqueous tetramethylammonium hydroxide solution (product name: NMD-3, manufactured by Tokyo Ohka Kogyo Co., Ltd.), respectively.

[Evaluation of Line Width Roughness (LWR)]

With respect to each of the LS patterns having a line width of 160 nm and a pitch of 320 nm that was formed with the above Eop, the line width at 400 points in the lengthwise direction of the line was measured using a measuring scanning electron microscope (SEM) (product name: S-9380, manufactured by Hitachi, Ltd.; acceleration voltage: 800V). From the results, the value of 3 times the standard deviation s (i.e., 3 s) was determined, and the average of the 3 s values at 5 points was calculated as "LWR (nm)". The results are shown in Tables 3 to 7.

The smaller this 3 s value is, the lower the level of roughness of the line width, indicating that a LS pattern with a uniform width was obtained.

[Evaluation of Resistance to Pattern Collapse]

In the formation of a LS pattern with a target dimension of a line width of 160 nm and a pitch of 320 nm, the line width immediately before the pattern collapse (i.e., the critical dimension at which the pattern had been resolved) was measured by gradually increasing the exposure time during the selective exposure to make the exposure dose exceed the Eop. The obtained results are indicated as "Pattern collapse (nm)" in Tables 3 to 7.

TABLE 3

|  | Example 1 | Example 2 | Comparative Example 1 |
|---|---|---|---|
| Resist composition |  | (1) |  |
| Developing solution | MeOH | EtOH | TMAH |
| PAB/PEB (° C.) | 120/100 | 120/100 | 120/100 |
| Eop (mJ/cm$^2$) | 25 | 24 | 28 |
| LWR (nm) | 8.6 | 10.4 | 11.3 |
| Pattern collapse (nm) | 45.6 | 40.9 | 75.5 |

TABLE 4

|  | Ex. 3 | Ex. 4 | Ex. 5 | Comp. Ex. 2 | Ex. 6 | Comp. Ex. 3 | Ex. 7 | Comp. Ex. 4 | Ex. 8 | Comp. Ex. 5 |
|---|---|---|---|---|---|---|---|---|---|---|
| Resist composition | (2) |  |  |  | (3) |  | (4) |  | (5) |  |
| Developing solution | MeOH | EtOH | IPA | TMAH | MeOH | TMAH | MeOH | TMAH | MeOH | TMAH |
| PAB/PEB (° C.) | 120/120 |  |  |  | 120/120 |  | 120/120 |  | 120/120 |  |
| Eop (mJ/cm$^2$) | 29 | 29 | 31 | 32 | 31 | 36 | 30 | 35 | 26 | 29 |
| LWR (nm) | 9.1 | 10.2 | 10.8 | 12.4 | 8.2 | 11.8 | 8.5 | 12.4 | 8.0 | 10.9 |
| Pattern collapse (nm) | 47.9 | 45.7 | 44.8 | 81.1 | 48.4 | 82.0 | 47.1 | 81.4 | 47.4 | 80.3 |

TABLE 5

|  | Ex. 9 | Comp. Ex. 6 | Ex. 10 | Comp. Ex. 7 | Ex. 11 | Comp. Ex. 8 | Ex. 12 | Comp. Ex. 9 | Ex. 13 | Comp. Ex. 10 |
|---|---|---|---|---|---|---|---|---|---|---|
| Resist composition | (6) |  | (7) |  | (8) |  | (9) |  | (10) |  |
| Developing solution | MeOH | EtOH | MeOH | EtOH | MeOH | EtOH | MeOH | EtOH | MeOH | EtOH |
| PAB/PEB (° C.) | 120/120 |  | 120/120 |  | 120/100 |  | 100/85 |  | 100/85 |  |
| Eop (mJ/cm$^2$) | 26 | 30 | 25 | 28 | 24 | 29 | 23 | 29 | 27 | 31 |
| LWR (nm) | 8.1 | 11.0 | 7.8 | 10.8 | 8.3 | 11.7 | 7.5 | 11.0 | 8.7 | 12.6 |
| Pattern collapse (nm) | 47.8 | 79.5 | 46.6 | 76.7 | 46.9 | 77.7 | 47.0 | 78.2 | 43.9 | 75.2 |

TABLE 6

|  | Ex. 14 | Comp. Ex. 11 | Ex. 15 | Comp. Ex. 12 | Ex. 16 | Comp. Ex. 13 | Ex. 17 | Comp. Ex. 14 | Ex. 18 | Comp. Ex. 15 |
|---|---|---|---|---|---|---|---|---|---|---|
| Resist composition | (11) | | (12) | | (13) | | (14) | | (15) | |
| Developing solution | MeOH | EtOH | MeOH | EtOH | MeOH | EtOH | MeOH | EtOH | MeOH | EtOH |
| PAB/PEB (° C.) | 120/100 | | 100/85 | | 100/85 | | 100/90 | | 100/85 | |
| Eop (mJ/cm$^2$) | 23 | 29 | 25 | 31 | 22 | 27 | 26 | 32 | 24 | 30 |
| LWR (nm) | 7.2 | 10.8 | 7.6 | 11.1 | 7.3 | 11.0 | 8.0 | 12.3 | 7.9 | 12.0 |
| Pattern collapse (nm) | 47.8 | 79.4 | 45.9 | 78.2 | 47.4 | 79.5 | 45.8 | 80.1 | 47.8 | 79.4 |

TABLE 7

|  | Ex. 19 | Comp. Ex. 16 | Ex. 20 | Comp. Ex. 17 | Ex. 21 | Comp. Ex. 18 |
|---|---|---|---|---|---|---|
| Resist composition | (16) | | (17) | | (18) | |
| Developing solution | MeOH | EtOH | MeOH | EtOH | MeOH | EtOH |
| PAB/PEB (° C.) | 100/90 | | 100/85 | | 100/85 | |
| Eop (mJ/cm$^2$) | 25 | 29 | 24 | 28 | 24 | 29 |
| LWR (nm) | 7.4 | 10.9 | 8.3 | 11.2 | 8.4 | 11.5 |
| Pattern collapse (nm) | 46.9 | 77.4 | 48.0 | 78.0 | 49.1 | 79.5 |

It is clear from the results shown in Tables 3 to 7 that in the resist patterns formed by the methods of Examples 1 to 21, as compared to the resist patterns formed by the methods of corresponding Comparative Examples 1 to 18, roughness was further reduced and the patterns were also unlikely to collapse.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A method of forming a resist pattern comprising:
   forming a resist film on a substrate using a resist composition containing a base component (A) which exhibits increased solubility in an organic solvent under action of acid and an acid generator component (B) which generates acid upon exposure;
   conducting exposure of said resist film; and
   patterning said resist film by positive development using a developing solution containing said organic solvent to form a resist pattern,
   wherein a resin component (A1) containing a structural unit (a1) derived from an acrylate ester which may have a hydrogen atom bonded to a carbon atom on the α-position substituted with a substituent and contains an acid decomposable group which exhibits increased polarity by action of acid is used as said base component (A), and
   a developing solution that contains an alcohol-based solvent but contains substantially no alkali components is used as said developing solution.

2. The method of forming a resist pattern according to claim 1, wherein said developing solution consists of an alcohol-based solvent.

3. The method of forming a resist pattern according to claim 1,
   wherein said resin component (A1) further includes at least one type of structural unit selected from the group consisting of a structural unit (a2) derived from an acrylate ester and contains a lactone-containing cyclic group and a structural unit (a0) derived from an acrylate ester and contains a —SO$_2$— containing cyclic group, and
   the acrylate ester in said structural unit (a2) and said structural unit (a0) may have a hydrogen atom bonded to a carbon atom on the α-position substituted with a substituent.

4. The method of forming a resist pattern according to any one of claims 1 to 3, wherein said resin component (A1) further includes a structural unit (a3) derived from an acrylate ester which may have a hydrogen atom bonded to a carbon atom on the α-position substituted with a substituent and contains a polar group-containing aliphatic hydrocarbon group.

5. The method of forming a resist pattern according to claim 1, wherein the alcohol-based solvent is a monohydric alcohol.

6. The method of forming a resist pattern according to claim 1, wherein the alcohol-based solvent is at least one selected from the group consisting of methyl alcohol, ethyl alcohol and isopropyl alcohol.

* * * * *